United States Patent [19]

Hyakutake

[11] Patent Number: 5,521,647
[45] Date of Patent: May 28, 1996

[54] INTEGRATED CIRCUIT DEVICE FOR PROCESSING IMAGE SIGNAL

[75] Inventor: Junichi Hyakutake, Itami, Japan

[73] Assignee: Mitsubishi Denki Kabushiki Kaisha, Tokyo, Japan

[21] Appl. No.: 333,299

[22] Filed: Nov. 1, 1994

[30] Foreign Application Priority Data

Dec. 1, 1993 [JP] Japan ..................... 5-301712

[51] Int. Cl.$^6$ .............................. H04N 5/14; H04N 9/64
[52] U.S. Cl. ................... 348/571; 348/705; 348/500; 348/521
[58] Field of Search ...................... 348/571, 500, 348/525, 521, 705, 706; 345/10, 11, 22, 205, 213; H04N 9/64, 5/14, 5/265, 5/268

[56] References Cited

U.S. PATENT DOCUMENTS 4,638,181  1/1987  Deiss ..................... 348/706

OTHER PUBLICATIONS

National Semiconductor Company, Sep. 1991, "LM1204 150 MHz RGB Video Amplifier System", pp. 13–14.

Primary Examiner—James J. Groody
Assistant Examiner—Nina N. West
Attorney, Agent, or Firm—Oblon, Spivak, McClelland, Maier & Neustadt

[57] ABSTRACT

An integrated circuit device for processing an image signal has an inexpensive structure and an excellent signal processing characteristic. The integrated circuit device (3) formed on one integrated circuit substrate comprises a switch circuit (4), a separator circuit (8) and preamp circuits (5) to (7). The separator circuit (8) has an input terminal which has an input impedance which is sufficiently higher than an output impedance of the switch circuit (4). Receiving an output of the switch circuit (4) at such an input terminal, the separator circuit (8) filters off high-frequency components including the maximum frequency of the image signal and outputs signal components which belong to a frequency band which is related to a synchronization signal. The preamp circuits (5) to (7) amplify and output image signals which are outputted by the switch circuit (4). Having a high input impedance, the separator circuit (8) supplies image signals to the preamp circuits (5) to (7) without deteriorating the maximum frequency of the image signals. It is also possible to lower the frequency of a signal which is outputted at an output terminal 3p and hence to prevent disturbance to outside.

33 Claims, 16 Drawing Sheets

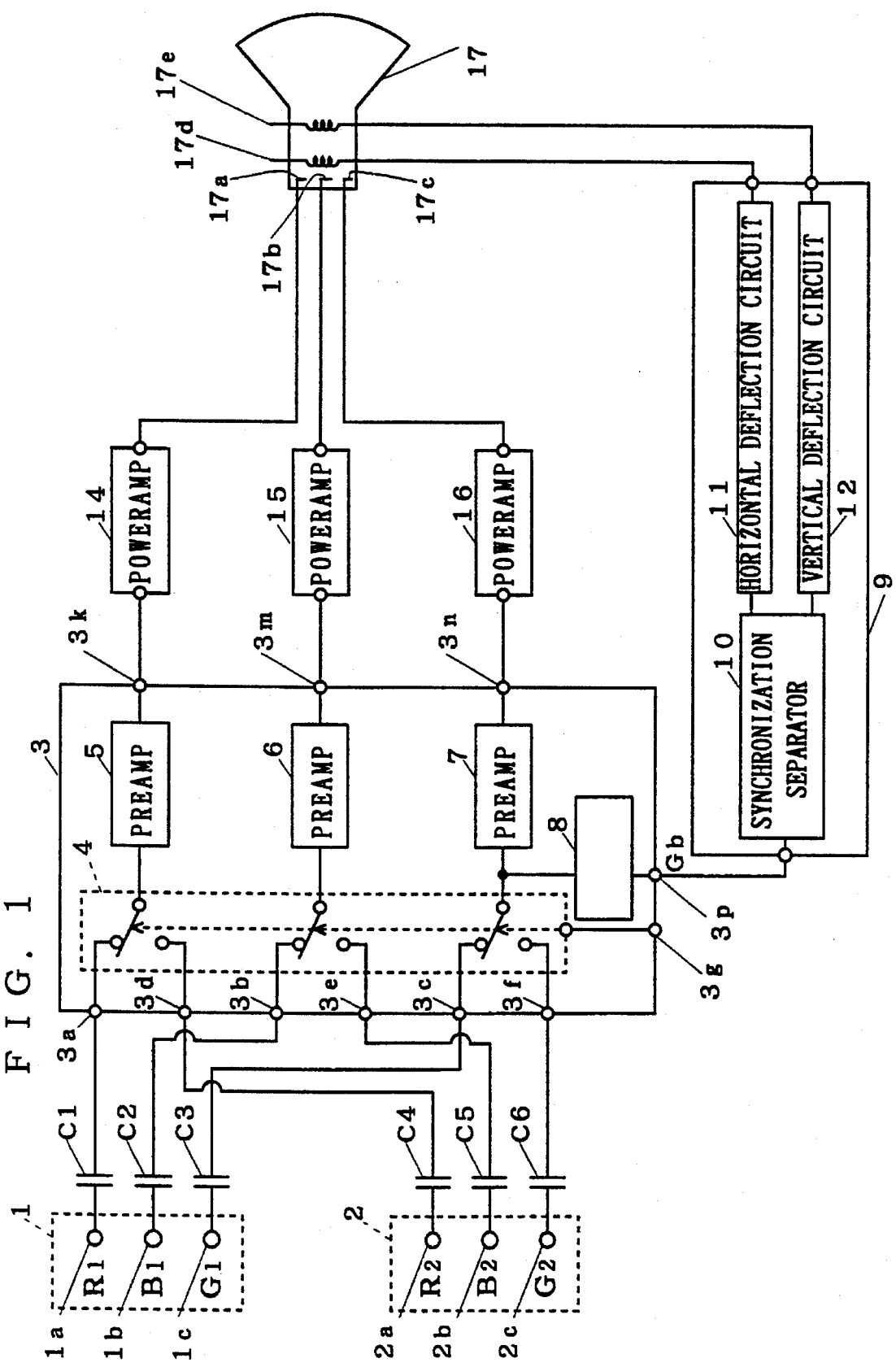

3a

3b

3c 3d, 3e, 3f

3p

F I G. 9
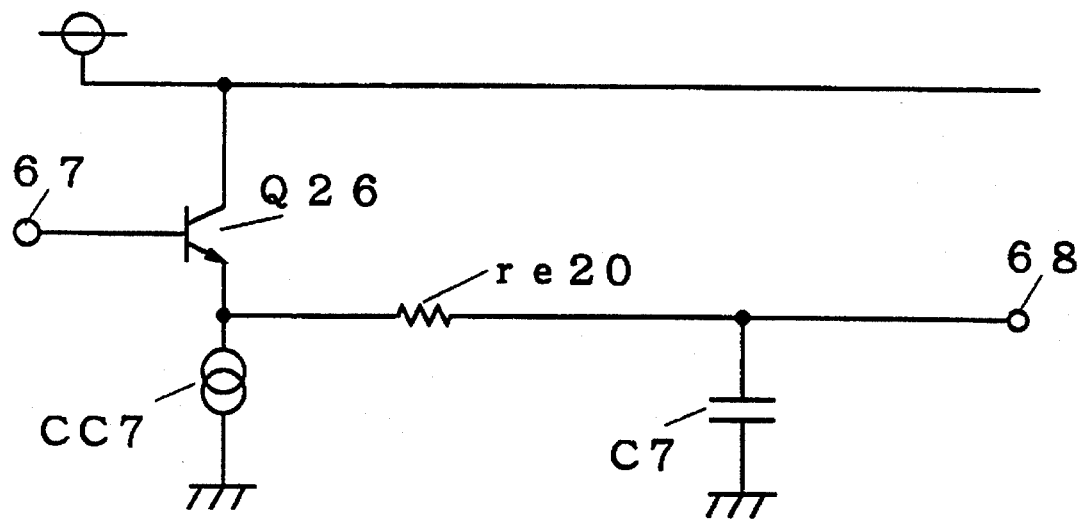

FIG. 12
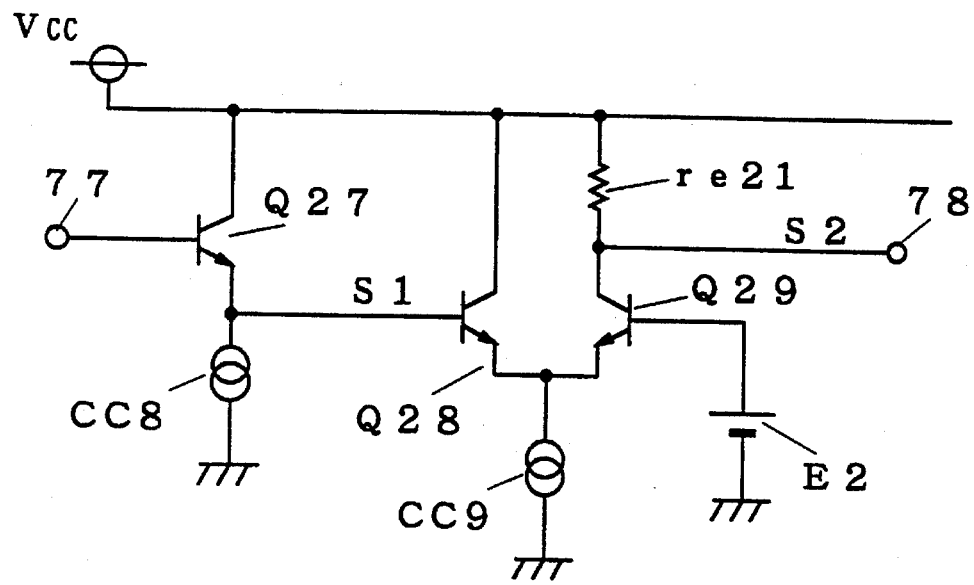
FIG. 13A
FIG. 13B
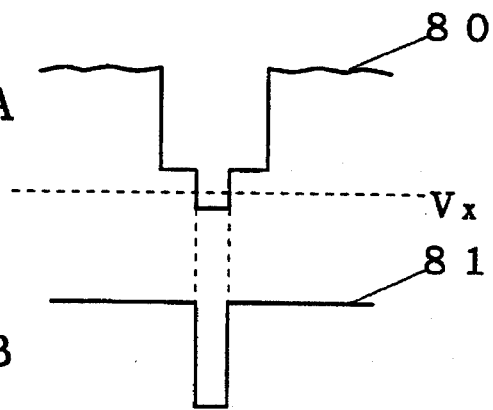

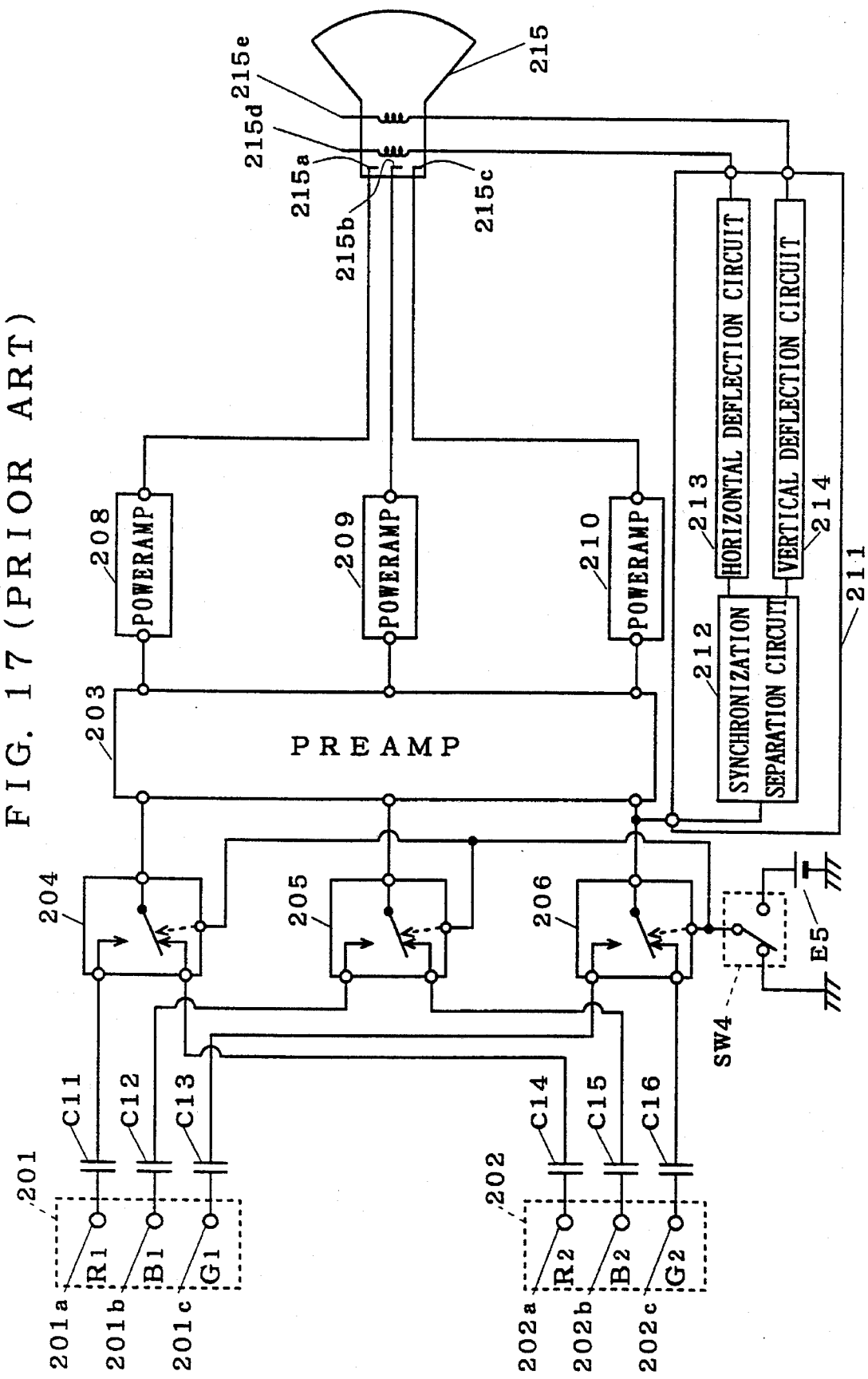

INTEGRATED CIRCUIT DEVICE FOR PROCESSING IMAGE SIGNAL

BACKGROUND OF THE INVENTION

1. Field of the Invention

The present invention relates to an integrated circuit device which is used in a display apparatus in order to process an image signal which is supplied to the integrated circuit device from a computer.

2. Description of the Background Art

In general, in order to output an image, a computer provides a display apparatus with information about the image in the form of three different signals Red, Green and Blue (hereinafter "R, G and B"). The display apparatus receives and processes these signals to display the information supplied to the integrated circuit device from the computer.

Sometimes, one display apparatus is shared by a plurality of computers. In such a case, the display apparatus includes a plurality of connectors so that the display apparatus can select a computer which is connected to any one of the connectors.

There are various connection methods for connecting the display apparatus and the computers. This is because there is no standard with respect to a connection method for connecting display apparatuses and computers. Rather, there are various standards to deal with various kinds of image signals of a variety of characteristics such as different frequencies outputted by the computers. To make it possible to connect a display apparatus with computers which are designed in conformity with different standards for connection, in most cases, the display apparatus includes a plurality of connectors of different configurations.

Since the display apparatus is to process signals supplied through the connectors of the computers which output information, the connectors and signal processing parts of the display apparatus must be connected with each other within the display apparatus. To this end, a change-over switch must be disposed for selecting connections between the respective connectors and the signal processing parts (i.e., preamplifiers).

To display an image, the display apparatus needs an image signal which consists of three color signals R, G and B as well as a synchronization signal. There are two methods of outputting a synchronization signal from a computer to the display apparatus, one in which a synchronization signal is transferred on a signal line which is disposed independently of a signal line for transmitting an image signal, and the other in which a synchronization signal is superimposed on one of the signals R, G and B. In the latter method, in general, a synchronization signal is superimposed on the signal G. The signal G must be supplied to a synchronization separation circuit as well which is the first signal processing part of a synchronization circuit in this case.

FIG. 17 shows a circuit structure of a portion of the display apparatus where a signal is processed. In FIG. 17, indicated at numerical reference 201 is a connector which is connected to a computer or the like to receive an image signal which consists of three signals $R_1$, $G_1$ and $B_1$, indicated at numerical reference 202 is a connector which is connected to a computer or the like to receive an image signal which consists of three signals $R_2$, $G_2$ and $B_2$, indicated at reference characters c11 to c13 are capacitors for cutting direct current components of the signals $R_1$, $B_1$ and $G_1$, and indicated at reference characters c14 to c16 are capacitors for cutting direct current components of the signals $R_2$, $B_2$ and $G_2$. Indicated at numerical reference 204 is a relay for receiving the signals $R_1$ and $R_2$ and outputting one of the two signals in accordance with a signal which is received at its control terminal, indicated at numerical reference 205 is a relay for receiving the signals $B_1$ and $B_2$ and outputting one of the two signals in accordance with a signal which is received at its control terminal, and indicated at numerical reference 206 is a relay for receiving the signals $G_1$ and $G_2$ and outputting one of the two signals in accordance with a signal which is received at its control terminal. A symbol SW4 denotes a switch for switching the control signals which are supplied to the relays 204 to 206. A preamplification part (hereinafter "preamp part") formed in one chip to amplify a received image signal to an intermediate level is indicated at 203. By means of a switching operation of the switch SW4, the levels of the control signals which are supplied to the relays 204 to 206 are switched simultaneously between a high level (a power source potential supplied from a direct current power source E5) and a low level (a ground potential). Hence, by switching the relays 204 to 206 at the same time, either signal set of the color signals $R_1$, $B_1$, $G_1$ or $R_2$, $B_2$, $G_2$ is supplied to the preamp part 203. The relays 204 to 206 are each formed by parts which are not shared by the preamp portion 203.

In FIG. 17, power amplification parts (hereinafter each "poweramp part") are indicated at 208, 209 and 210 which amplify and output the signals R, B and G, respectively, which were already amplified by the preamp part 203. Indicated at numerical reference 211 is a deflection circuit for creating a current which horizontally and vertically deflects an electron beam which is used to display an image on a screen from the synchronization signal which is included in the signal G. Indicated at numerical reference 212 is a synchronization separation circuit for separating the synchronization signal from the signal G which is supplied to the deflection circuit 211. Indicated at numerical reference 213 is a horizontal deflection circuit for generating a sawtooth current used for horizontal synchronization from the synchronization signal which is outputted from the synchronization separation circuit 212. Indicated at numerical reference 214 is a vertical deflection circuit for generating a sawtooth current used for vertical synchronization from the synchronization signal which is outputted from the synchronization separation circuit 212. Indicated at numerical reference 215 is a CRT which is connected to the poweramp parts 208 to 210 and the deflection circuit 211 to display the image signal. The CRT 215 includes electron guns 215a, 215b and 215c which emit electron beams under the control of outputs of the poweramp parts 208, 209 and 210, respectively. The CRT 215 also includes a horizontal deflection coil for horizontally deflecting the electron beams under the control of an output of a horizontal deflection circuit 11 and a vertical deflection coil for vertically deflecting the electron beams under the control of an output of a vertical deflection circuit 12.

In general, the preamp part is formed as an IC. For this reason, in some cases, the preamp part is formed to include independent parts for respectively processing the signals R, G and B; that is, the preamp part is formed by three ICs. In the display apparatus of FIG. 17, the preamp part 203 is formed by one IC which is capable of processing the signals R, G and B at the same time. The preamp part adjusts a contrast between the signals R, G and B and amplifies the voltages of the signals R, G and B so that the signals R, G and B have amplitudes sufficiently large as inputs to the poweramp parts. The deflection circuit 211 is formed independently of the preamp part 203.

In the conventional display apparatus having such a structure as above, either the signals $R_1$, $G_1$, and $B_1$ or the signals $R_2$, $G_2$ and $B_2$ from the two connectors 201 and 202 are selected by the relays 204 to 206 and provided to the preamp part 203 while selecting and supplying either one of the signal $G_1$ and the signal $G_2$ to the deflection circuit 211.

For instance, mechanical relays are used as the relays 204 to 206. However, the use of mechanical relays has a problem that an inductance, a resistance component and a floating capacitance component against ground from the input to the output of the relay, are large beyond allowable levels with respect to a signal frequency (of 100 to 200 MHz, for example). This eventually deteriorates the frequency characteristics of the signals which are transmitted through the relays 204 to 206. Although the inductances and the like of the relays must be reduced by using an expensive material for contacts or insulators of the relays and suppressing deterioration of the frequency characteristics, since manufacturing of such relays is difficult, use of such relays in the display apparatus increases the overall manufacturing cost.

To a further disadvantage, use of such relays in the display apparatus requires longer signal lines to connect the relays 204 to 206 with the preamp part 203. This causes interference between the signal lines and other circuits. As a result, the signal R, G or B adversely effects the other circuits as noise.

In addition, since the signal G includes the synchronization signal, it is necessary to connect an output of the relay 206 with the synchronization separation circuit 212. To this end, the relay 206 needs be designed to have a different impedance matching from those of the relays 204 and 205.

When these circuits are all integrated as electronic circuits of an IC, the resulting IC includes both an image signal processing part (i.e., the preamp part 203 and the poweramp parts 208 to 210) and the deflection circuit 211. This excessively intensifies interference between the image signal and increases a deflection signal and a consumption power.

SUMMARY OF THE INVENTION

In a first aspect of the present invention, an integrated circuit device for processing an image signal, comprises: a first input terminal formed in an integrated circuit substrate to receive a first image signal which includes a first synchronization signal; a second input terminal formed in the integrated circuit substrate to receive a second image signal which includes a second synchronization signal; a control terminal formed in the integrated circuit substrate to receive a switch signal; a synchronization signal output terminal formed in the integrated circuit substrate to output a signal which includes the first or the second synchronization signal; switch means formed in the integrated circuit substrate, the switch means having first and second image signal input terminals which are respectively connected to the first and the second input terminals, the switch means having a switch signal input terminal which is connected to the control terminal, the switch means having an image signal output terminal, from image signal output terminal, the switch means outputting either one of the first and the second image signals which are received at the first and the second image input terminals in accordance with the switch signal which is received at the switch signal input terminal; signal separation means formed in the integrated circuit substrate, the signal separation means having a high impedance input terminal which is connected to the image signal output terminal of the switch means, the high impedance input terminal having an input impedance which is sufficiently higher than an output impedance of the switch means, the signal separation means having an output terminal which is connected to the synchronization signal output terminal, the signal separation means receiving either one of the first and the second image signals at the high impedance input terminal, the signal separation means removing a high-frequency component including a maximum frequency of one of the image signals which is supplied to the signal separation means, the signal separation means at the output terminal outputting a signal component which belongs to a frequency band regarding the first and the second synchronization signals; and amplification means formed in the integrated circuit substrate, the amplification means having an input terminal which is connected directly to the image signal output terminal of the switch means, the amplification means amplifying one of the first and the second image signals which is outputted by the switch means.

Preferably, the signal separation means includes a current path disposed between first and second power source potentials through which a predetermined constant current flows, a first bipolar transistor having a collector and an emitter connected in a forward direction in the current path and a base connected to the high impedance input terminal of the switch means, the emitter of the first bipolar transistor being connected to the output terminal of the signal separation means. The first bipolar transistor has a cutoff frequency which is higher than a signal component which belongs to a frequency band regarding the first and the second synchronization signals but is lower than a cutoff frequency of the image signal.

Further, switch means may include: a second bipolar transistor having a base which is connected to the first image signal input terminal, a collector which receives the first power source potential and an emitter which is connected to the image signal output terminal; a third bipolar transistor having a base which is connected to the second image signal input terminal, a collector which is connected to the first power source potential and an emitter which is connected to the image signal output terminal; first resistor means having one end which is connected to the image signal output terminal and another end which receives the second power source potential; first variable resistor means having one end which is connected to the base of the second bipolar transistor and another end which receives the second power source potential, the first variable resistor means switching between a high resistance value and a low resistance value in accordance with the switch signal which is received at the switch signal input terminal; and second variable resistor means having one end which is connected to the base of the third bipolar transistor and another end which receives the second power source potential, the second variable resistor means switching between a high resistance value and a low resistance value in accordance with the switch signal which is received at the switch signal input terminal. The first and the second variable resistor means switch their resistance values in accordance with the switch signal so that their resistance values are complementary to each other.

Preferably, an area where the base and the emitter of the first bipolar transistor face each other is smaller than a corresponding area of each one of the second and the third bipolar transistors.

According to a second aspect of the present invention, in the integrated circuit device of the first aspect of the present invention, the signal separation means includes buffer means having an input terminal which is connected to the high impedance input terminal and an output terminal for buffering and outputting one of the first and the second image signals which is supplied to the signal separation means at the input terminal, the buffer means supplying a high impedance to the high impedance input terminal; and a low-pass filter having a signal input terminal which is connected to the output terminal of the buffer means and a signal output terminal which is connected to the output terminal of the signal separation means, the low-pass filter removing a high-frequency component including a maximum frequency of one of the image signals which is supplied to the signal separation means, the low-pass filter outputting at the output terminal a signal component which belongs to a frequency band regarding the first and the second synchronization signals.

In the second aspect of the present invention, the switch means preferably includes: a first bipolar transistor having a base which is connected to the first image signal input terminal, a collector which receives the first power source potential and an emitter which is connected to the image signal output terminal; a second bipolar transistor having a base which is connected to the second image signal input terminal, a collector which receives the first power source potential and an emitter which is connected to the image signal output terminal; first resistor means having one end which is connected to the image signal output terminal and another end which receives the second power source potential; first variable resistor means having one end which is connected to the base of the first bipolar transistor and another end which receives the second power source potential, the first variable resistor means switching between a high resistance value and a low resistance value in accordance with the switch signal which is received at the switch signal input terminal; and second variable resistor means connected between the base of the second bipolar transistor and the second power source potential, the second variable resistor means switching between a high resistance value and a low resistance value in accordance with the switch signal which is received at the switch signal input terminal. The first and the second variable resistor means switch their resistance values in accordance with the switch signal so that their resistance values are complementary to each other.

Further, the buffer means may include a current path disposed between first and second power source potentials through which a predetermined constant current flows, a third bipolar transistor having a collector, an emitter which is connected to the output terminal of the buffer means and a base which is connected to the high impedance signal input terminal of the signal separation means, the collector and the emitter being connected in a forward direction in the current path, and the low-pass filter may include: second resistor means having one end which is connected to the emitter of the third bipolar transistor and another end which is connected to the output terminal of the signal separation means; and a capacitor having one end which is connected to the output terminal of the signal separation means and another end which receives the first or the second power source potential.

According to a third aspect of the present invention, in the integrated circuit device of the first aspect of the present invention, the signal separation means includes: buffer means having an input terminal which is connected to the high impedance input terminal and an output terminal for buffering and outputting one of the first and the second image signals which is supplied to the signal separation means at the input terminal, the buffer means supplying a high impedance to the high impedance input terminal; and a synchronization separating circuit having a signal input terminal which is connected to the output terminal of the buffer means and a signal output terminal which is connected to the output terminal of the signal separation means, the synchronization separating circuit separating the first or the second synchronization signal from the one of the first and the second image signals which is supplied to the signal separation means and outputting the first or the second synchronization signal at the signal output terminal.

In a fourth aspect of the present invention, an integrated circuit device is capable of processing a first image signal and a second image signal in one integrated circuit substrate, the first image signal including a first chrominance signal which includes a first synchronization signal, a second chrominance signal which is different from the first chrominance signal and a third chrominance signal which is different from the first and the second chrominance signals, the second image signal including a fourth chrominance signal which includes a second synchronization signal, a fifth chrominance signal which is different from the fourth chrominance signal and a sixth chrominance signal which is different from the fourth and the fifth chrominance signals. The integrated circuit device comprises: first, second and third input terminals formed in the integrated circuit substrate to receive the first, the second and the third chrominance signals, respectively; fourth, fifth and sixth input terminals formed in the integrated circuit substrate to receive the fourth, the fifth and the sixth chrominance signals, respectively; a control terminal formed in the integrated circuit substrate to receive a switch signal; a synchronization signal output terminal formed in the integrated circuit substrate to output a signal which includes the first or the second synchronization signal from the integrated circuit substrate; switch means formed in the integrated circuit substrate, the switch means having first to sixth chrominance signal input terminals which are respectively connected to the first to the sixth input terminals, the switch means having a switch signal input terminal which is connected to the control terminal, the switch means having first to third chrominance signal output terminals, the switch means selectively outputting the first to the third chrominance signals or the fourth to the sixth chrominance signals, respectively, at the first to the third chrominance signal output terminals in accordance with the switch signal which is received at the switch signal input terminal; signal separation means formed in the integrated circuit substrate, the signal separation means having a high impedance input terminal which is connected to the first chrominance signal output terminal of the switch means, the high impedance input terminal having an input impedance which is sufficiently higher than an output impedance of the first chrominance signal output terminal, the signal separation means having an output terminal which is connected to the synchronization signal output terminal, the signal separation means removing a high-frequency component including a maximum frequency of the chrominance signal which is supplied to the signal separation means at the high impedance input terminal and outputting a signal component which belongs to a frequency band regarding the first and the second synchronization signals at the output terminal; and amplification means formed in the integrated circuit substrate, the amplification means having a plurality of input terminals which are respectively connected to the first, the second and the third chrominance signal output terminals of the switch means, the amplification means amplifying the chrominance signal which is outputted by the switch means.

In the fourth aspect of the present invention, the signal separation means includes a current path disposed between first and second power source potentials through which a predetermined constant current flows, a first bipolar transistor having a collector and an emitter connected in a forward direction in the current path and a base connected to the high impedance input terminal of the signal switch means, and the first bipolar transistor has a cutoff frequency which is higher than a signal component which belongs to a frequency band regarding the first and the second synchronization signals but is lower than a cutoff frequency of the image signal.

Preferably, the switch means includes: a second bipolar transistor having a base which is connected to the first chrominance signal input terminal, a collector which receives the first power source potential and an emitter which is connected to the first chrominance signal output terminal; a third bipolar transistor having a base which is connected to the second chrominance signal input terminal, a collector which receives the first power source potential and an emitter which is connected to the first chrominance signal output terminal; first resistor means having one end which is connected to the first chrominance signal output terminal and another end which receives the second power source potential; first variable resistor means having one end which is connected to the base of the second bipolar transistor and another end which receives the second power source potential, the first variable resistor means switching between a high resistance value and a low resistance value in accordance with the switch signal which is received at the switch signal input terminal; and second variable resistor means having one end which is connected to the base of the third bipolar transistor and another end which receives the second power source potential, the second variable resistor means switching between a high resistance value and a low resistance value in accordance with the switch signal which is received at the switch signal input terminal. The first and the second variable resistor means switch their resistance values in accordance with the switch signal so that their resistance values are complementary to each other.

Preferably, an area where the base and the emitter of the first bipolar transistor face each other is smaller than a corresponding area of each one of the second and the third bipolar transistors.

Preferably, the signal separation means includes: buffer means having an input terminal which is connected to the high impedance input terminal and an output terminal for buffering and outputting one of the first and the fourth chrominance signals which is supplied to the signal separation means at the input terminal, the buffer means supplying a high impedance to the high impedance input terminal; and a low-pass filter having a signal input terminal which is connected to the output terminal of the buffer means and a signal output terminal which is connected to the output terminal of the signal separation means, the low-pass filter removing a high-frequency component including a maximum frequency of the first or the fourth chrominance signal which is supplied to the signal separation means and outputting a signal component which belongs to a frequency band regarding the first and the second synchronization signals at the output terminal.

Preferably, the switch means includes: a first bipolar transistor having a base which is connected to the first chrominance signal input terminal, a collector which receives the first power source potential and an emitter which is connected to the first chrominance signal output terminal; a second bipolar transistor having a base which is connected to the fourth chrominance signal input terminal, a collector which receives the first power source potential and an emitter which is connected to the first chrominance signal output terminal; first resistor means having one end which is connected to the image signal output terminal and another end which receives the second power source potential; first variable resistor means having one end which is connected to the base of the first bipolar transistor and another end which receives the second power source potential, the first variable resistor means switching between a high resistance value and a low resistance value in accordance with the switch signal which is received at the switch signal input terminal; and second variable resistor means connected between the base of the second bipolar transistor and the second power source potential, the second variable resistor means switching between a high resistance value and a low resistance value in accordance with the switch signal which is received at the switch signal input terminal. The first and the second variable resistor means switch the resistance values in a mutually complementary manner in accordance with the switch signal.

Preferably, the buffer means includes a current path disposed between first and second power source potentials through which a predetermined constant current flows, a third bipolar transistor having a collector, an emitter which is connected to the output terminal of the buffer means and a base which is connected to the high impedance signal input terminal of the signal separation means, the collector and the emitter being connected in a forward direction in the current path. The low-pass filter includes: second resistor means having one end which is connected to the emitter of the third bipolar transistor and another end which is connected to the output terminal of the signal separation means; and a capacitor having one end which is connected to the output terminal of the signal separation means and another end which receives the first or the second power source potential.

Alternatively, the signal separation means includes: buffer means having an input terminal which is connected to the high impedance input terminal and an output terminal for buffering and outputting one of the first and the second image signals which is supplied to the signal separation means at the input terminal, the buffer means supplying a high impedance to the high impedance input terminal; and a synchronization separating circuit having a signal input terminal which is connected to the output terminal of the buffer means and a signal output terminal which is connected to the output terminal of the signal separation means, the synchronization separating circuit separating the first or the second synchronization signal from the one of the first and the second image signals which is supplied to the signal separation means and outputting the first or the second synchronization signal at the signal output terminal.

In a fifth aspect of the present invention, an integrated circuit device is capable of processing a first image signal and a second image signal in one integrated circuit substrate, the first image signal including a first chrominance signal which includes a first synchronization signal, a second chrominance signal which is different from the first chrominance signal and a third chrominance signal which is different from the first and the second chrominance signals, the second image signal including a fourth chrominance signal, a fifth chrominance signal which is different from the fourth chrominance signal and a sixth chrominance signal which is different from the fourth and the fifth chrominance signals. The integrated circuit device comprises: first, second and third input terminals formed in the integrated circuit substrate to receive the first, the second and the third chrominance signals, respectively; fourth to seventh input terminals formed in the integrated circuit substrate to receive the fourth to the sixth chrominance signals and the second synchronization signal, respectively; a control terminal formed in the integrated circuit substrate to receive a switch signal; a first synchronization signal output terminal formed in the integrated circuit substrate to output a signal which includes the first synchronization signal from the integrated circuit substrate; a second synchronization signal output terminal formed in the integrated circuit substrate to output a signal which includes the second synchronization signal from the integrated circuit substrate; switch means formed in the integrated circuit substrate, the switch means having first to sixth chrominance signal input terminals which are respectively connected to the first to the sixth input terminals, the switch means having a switch signal input terminal which is connected to the control terminal, the switch means having a synchronization signal input terminal which is connected to the seventh input terminal, the switch means having a synchronization signal output terminal which is connected to the second synchronization signal output terminal, the switch means having first to third chrominance signal output terminals, the switch means selectively outputting the first to the third chrominance signals or the fourth to the sixth chrominance signals, respectively, at the first to the third chrominance signal output terminals in accordance with the switch signal which is received at the switch signal input terminal, the switch means determining whether the second synchronization signal is to be outputted at the synchronization signal output terminal; signal separation means formed in the integrated circuit substrate, the signal separation means having a high impedance input terminal which is connected to the first chrominance signal output terminal of the switch means, the high impedance input terminal having an input impedance which is sufficiently higher than an output impedance of the first chrominance signal output terminal, the signal separation means having an output terminal which is connected to the synchronization signal output terminal, the signal separation means removing a high-frequency component including a maximum frequency of the chrominance signal which is received at the high impedance input terminal and outputting a signal component which belongs to a frequency band regarding the first and the second synchronization signals at the output terminal; and amplification means formed in the integrated circuit substrate, the amplification means having a plurality of input terminals which are respectively connected directly to the first, the second and the third chrominance signal output terminals of the switch means, the amplification means amplifying the chrominance signal which is outputted by the switch means.

Preferably, the signal separation means includes a current path disposed between first and second power source potentials through which a predetermined constant current flows, a first bipolar transistor having a collector and an emitter connected in a forward direction in the current path and a base connected to the image signal output terminal of the switch means, the emitter of the first bipolar transistor being connected to the output terminal of the signal separation means. The first bipolar transistor has a cutoff frequency which is higher than a signal component which belongs to a frequency band regarding the first synchronization signal but is lower than a cutoff frequency of the first chrominance signal.

Preferably, the switch means includes: a second bipolar transistor having a base which is connected to the first chrominance signal input terminal, a collector which receives the first power source potential and an emitter which is connected to the first chrominance signal output terminal; a third bipolar transistor having a base which is connected to the fourth chrominance signal input terminal, a collector which receives the first power source potential and an emitter which is connected to the first chrominance signal output terminal; first resistor means having one end which is connected to the image signal output terminal and another end which receives the second power source potential; first variable resistor means having one end which is connected to the base of the second bipolar transistor and another end which receives the second power source potential, the first variable resistor means switching between a high resistance value and a low resistance value in accordance with the switch signal which is received at the switch signal input terminal; and second variable resistor means having one end which is connected to the base of the third bipolar transistor and another end which receives the second power source potential, the second variable resistor means switching between a high resistance value and a low resistance value in accordance with the switch signal which is received at the switch signal input terminal. The first and the second variable resistor means switch their resistance values in accordance with the switch signal so that their resistance values are complementary to each other.

Preferably, an area where the base and the emitter of the first bipolar transistor face each other is smaller than a corresponding area of each one of the second and the third bipolar transistors.

Preferably, the signal separation means includes: buffer means having an input terminal which is connected to the high impedance input terminal and an output terminal for buffering and outputting the first chrominance signal which is supplied to the signal separation means at the input terminal, the buffer means supplying a high impedance to the high impedance input terminal; and a low-pass filter having a signal input terminal which is connected to the output terminal of the buffer means and a signal output terminal which is connected to the output terminal of the signal separation means, the low-pass filter removing a high-frequency component including a maximum frequency of the first chrominance signal which is supplied to the signal separation means and outputting a signal component which belongs to a frequency band regarding the first synchronization signal at the output terminal.

Preferably, the switch means includes: a first bipolar transistor having a base which is connected to the first chrominance signal input terminal, a collector which is connected to the first power source potential and an emitter which is connected to the first chrominance signal output terminal; a second bipolar transistor having a base which is connected to the fourth chrominance signal input terminal, a collector which is connected to the first power source potential and an emitter which is connected to the first chrominance signal output terminal; first resistor means having one end which is connected to the first chrominance signal output terminal and another end which receives the second power source potential; first variable resistor means having one end which is connected to the base of the first bipolar transistor and another end which receives the second power source potential, the first variable resistor means switching between a high resistance value and a low resistance value in accordance with the switch signal which is received at the switch signal input terminal; and second variable resistor means having one end which is connected to the base of the second bipolar transistor and another end which receives the second power source potential, the second variable resistor means switching between a high resistance value and a low resistance value in accordance with the switch signal which is received at the switch signal input terminal. The first and the second variable resistor means switch the resistance values in a mutually complementary manner in accordance with the switch signal.

Preferably, the buffer means includes a current path disposed between first and second power source potentials through which a predetermined constant current flows, a third bipolar transistor having a collector, an emitter which is connected to the output terminal of the buffer means and a base which is connected to the high impedance signal input terminal of the signal separation means, the collector and the emitter being connected in a forward direction in the current path, and the low-pass filter includes: second resistor means having one end which is connected to the emitter of the third bipolar transistor and another end which is connected to the output terminal of the signal separation means; and a capacitor having one end which is connected to the output terminal of the signal separation means and another end which receives the first or the second power source potential.

Alternatively, the signal separation means includes: buffer means having an input terminal which is connected to the high impedance input terminal and an output terminal for buffering and outputting the first chrominance signal which is supplied to the signal separation means at the input terminal, the buffer means supplying a high impedance to the high impedance input terminal; and a synchronization separating circuit having a signal input terminal which is connected to the output terminal of the buffer means and a signal output terminal which is connected to the output terminal of the signal separation means, the synchronization separating circuit separating the first synchronization signal from the one of the first and the second image signals which is supplied to the signal separation means and outputting the first synchronization signal at the signal output terminal.

An integrated circuit device of a sixth aspect of the present invention is capable of processing a first image signal and a second image signal in one integrated circuit substrate, the first image signal including a first chrominance signal which includes a first synchronization signal, a second chrominance signal which is different from the first chrominance signal and a third chrominance signal which is different from the first and the second chrominance signals, the second image signal including a fourth chrominance signal which includes a second synchronization signal, a fifth chrominance signal which is different from the fourth chrominance signal and a sixth chrominance signal which is different from the fourth and the fifth chrominance signals. The integrated circuit device comprises: a first input terminal formed in a first integrated circuit substrate of the plurality of the integrated circuit substrates to receive the first chrominance signal; a second input terminal formed in the first integrated circuit substrate to receive the fourth chrominance signal; a first control terminal formed in the first integrated circuit substrate to receive a switch signal; a synchronization signal output terminal formed in the first integrated circuit substrate to output a signal which includes the first or the second synchronization signal from the integrated circuit substrates; first switch means formed in the first integrated circuit substrate, the first switch means having first and second chrominance signal input terminals which are respectively connected to the first and the second input terminals, the first switch means having a first switch signal input terminal which is connected to the control terminal, the first switch means having a first chrominance signal output terminal, from the first chrominance signal output terminal, the first switch means selectively outputting the first or the fourth chrominance signal in accordance with the switch signal which is received at the first switch signal input terminal; signal separation means formed in the first integrated circuit substrate, the signal separation means having a high impedance input terminal which is connected to the first chrominance signal output terminal of the first switch means, the high impedance input terminal having an input impedance which is sufficiently higher than an output impedance of the first chrominance signal output terminal, the signal separation means having an output terminal which is connected to the synchronization signal output terminal, the signal separation means removing a high-frequency component including a maximum frequency of the first or the fourth chrominance signal which is received at the high impedance input terminal and outputting a signal component which belongs to a frequency band regarding the first and the second synchronization signals at the output terminal; and first amplification means formed in the first integrated circuit substrate, the amplification means amplifying the first or the fourth chrominance signal which is outputted by the first switch means.

Preferably, the integrated circuit device further comprises: a third input terminal formed in a second integrated circuit substrate of the plurality of the integrated circuit substrates to receive the second chrominance signal; a fourth input terminal formed in the second integrated circuit substrate to receive the fifth chrominance signal; a second control terminal formed in the second integrated circuit substrate to receive a switch signal; second switch means formed in the second integrated circuit substrate, the second switch means having third and fourth chrominance signal input terminals which are respectively connected to the third and the fourth input terminals, a second switch signal input terminal which is connected to the second control terminal and a second chrominance signal input terminal, at the second chrominance signal output terminal, the second switch means selectively outputting the second or the fifth chrominance signal in accordance with the switch signal which is received at the second switch signal input terminal; second amplification means formed in the second integrated circuit substrate, the second amplification means amplifying the second or the fifth chrominance signal which is outputted by the second switch means; a fifth input terminal formed in a third integrated circuit substrate of the plurality of the integrated circuit substrates to receive the third chrominance signal; a sixth input terminal formed in the third integrated circuit substrate to receive the sixth chrominance signal; a third control terminal formed in the third integrated circuit substrate to receive a switch signal; third switch means formed in the third integrated circuit substrate, the third switch means having fifth and sixth chrominance signal input terminals which are respectively connected to the fifth and the sixth input terminals, a third switch signal input terminal which is connected to the third control terminal and a third chrominance signal input terminal, at the third chrominance signal output terminal, the third switch means selectively outputting the third or the sixth chrominance signal in accordance with the switch signal which is received at the third switch signal input terminal; and third amplification means formed in the third integrated circuit substrate, the third amplification means amplifying the third or the sixth chrominance signal which is outputted by the third switch means.

Preferably, the signal separation means includes a current path disposed between first and second power source potentials through which a predetermined constant current flows, a first bipolar transistor having a collector and an emitter connected in a forward direction in the current path and a base connected to the high impedance input terminal of the signal separation means, the emitter of the first bipolar transistor being connected to the output terminal of the signal separation means, and the first bipolar transistor has a cutoff frequency which is higher than a signal component which belongs to a frequency band regarding the first and the second synchronization signals but is lower than a cutoff frequency of the image signal.

Preferably, the switch means includes: a second bipolar transistor having a base which is connected to the first chrominance signal input terminal, a collector which receives the first power source potential and an emitter which is connected to the first chrominance signal output terminal; a third bipolar transistor having a base which is connected to the second chrominance signal input terminal, a collector which receives the first power source potential and an emitter which is connected to the first chrominance signal output terminal; first resistor means having one end which is connected to the image signal output terminal and another end which receives the second power source potential; first variable resistor means having one end which is connected to the base of the second bipolar transistor and another end which receives the second power source potential, the first variable resistor means switching between a high resistance value and a low resistance value in accordance with the switch signal which is received at the switch signal input terminal; and second variable resistor means having one end which is connected to the base of the third bipolar transistor and another end which receives the second power source potential, the second variable resistor means switching between a high resistance value and a low resistance value in accordance with the switch signal which is received at the switch signal input terminal. The first and the second variable resistor means switch their resistance values in accordance with the switch signal so that their resistance values are complementary to each other.

Preferably, an area where the base and the emitter of the first bipolar transistor face each other is smaller than a corresponding area of each one of the second and the third bipolar transistors.

Preferably, the signal separation means includes: buffer means having an input terminal which is connected to the high impedance input terminal and an output terminal for buffering and outputting one of the first and second chrominance signals which is supplied to the signal separation means at the input terminal, the buffer means supplying a high impedance to the high impedance input terminal; and a low-pass filter having a signal input terminal which is connected to the output terminal of the buffer means and a signal output terminal which is connected to the output terminal of the signal separation means, the low-pass filter removing a high-frequency component including a maximum frequency of the image signal which is supplied to the signal separation means and outputting a signal component which belongs to a frequency band regarding the first and the second synchronization signals at the output terminal.

Preferably, the switch means includes: a first bipolar transistor having a base which is connected to the first chrominance signal input terminal, a collector which receives the first power source potential and an emitter which is connected to the first chrominance signal output terminal; a second bipolar transistor having a base which is connected to the second chrominance signal input terminal, a collector which receives the first power source potential and an emitter which is connected to the first chrominance signal output terminal; first resistor means having one end which is connected to the first chrominance signal output terminal and another end which receives the second power source potential; first variable resistor means having one end which is connected to the base of the first bipolar transistor and another end which receives the second power source potential, the first variable resistor means switching between a high resistance value and a low resistance value in accordance with the switch signal which is received at the switch signal input terminal; and second variable resistor means having one end which is connected to the base of the second bipolar transistor and another end which receives the second power source potential, the second variable resistor means switching between a high resistance value and a low resistance value in accordance with the switch signal which is received at the switch signal input terminal. The first and the second variable resistor means switch the resistance values in a mutually complementary manner in accordance with the switch signal.

Preferably, the buffer means includes a current path disposed between first and second power source potentials through which a predetermined constant current flows, a third bipolar transistor having a collector, an emitter which is connected to the output terminal of the buffer means and a base which is connected to the high impedance signal input terminal of the signal separation means, the collector and the emitter being connected in a forward direction in the current path, and the low-pass filter includes: second resistor means having one end which is connected to the emitter of the third bipolar transistor and another end which is connected to the output terminal of the signal separation means; and a capacitor having one end which is connected to the output terminal of the signal separation means and another end which receives the first or the second power source potential.

Alternatively, the signal separation means includes: buffer means having an input terminal which is connected to the high impedance input terminal and an output terminal for buffering and outputting the first or the fourth chrominance signal which is supplied to the signal separation means at the input terminal, the buffer means supplying a high impedance to the high impedance input terminal; and a synchronization separating circuit having a signal input terminal which is connected to the output terminal of the buffer means and a signal output terminal which is connected to the output terminal of the signal separation means, the synchronization separating circuit separating the first or the second synchronization signal from the first or the fourth chrominance signal which is supplied to the signal separation means and outputting the first or the second synchronization signal at the signal output terminal.

Thus, in the first aspect of the present invention, the switch means receives the first and the second image signals which are supplied to the first and the second input terminal, respectively, and outputs either one of the first and the second image signals in accordance the switch signal which is supplied to the control terminal. The signal separation means receives either one of the first and the second image signals at the high impedance input terminal, filters off a high-frequency component including the maximum frequency of the received image signal and outputs a signal component which belongs to the frequency band which is related to the first and the second synchronization signals at the output terminal. The amplification means amplifies the image signal which is outputted by the switch means. Since these switch means, the signal separation means and the amplification means are formed on the same integrated circuit substrate and since the input impedance of the signal separation means is sufficiently higher than the output impedance of the switch means, it is easy to transmit the signal from the switch means to amplification means without removing the maximum frequency component of the image signals supplied to the first and the second input terminals. In addition, since the maximum frequency of the image signal is filtered off by the signal separation means, it is possible to suppress a noise or the like in outputting the synchronization signal from the integrated circuit device.

In the second aspect of the present invention, the signal separation means provides a high impedance to the high impedance input terminal in an easy manner so that by means of the buffer means, the signal will be transmitted from the switch means to amplification means without removing the maximum frequency component of the received image signal. Further, by means of the low-pass filter, the signal separation means suppresses a noise or the like in outputting the synchronization signal from the integrated circuit device. Hence, it is possible to easily filter off the maximum frequency component of the supplied image signal.

In the third aspect of the present invention, the signal separation means provides a high impedance to the high impedance input terminal in an easy manner so that by means of the buffer means, the signal will be transmitted from the switch means to amplification means without removing the maximum frequency component of the received image signal. Further, by means of the synchronization separating circuit, the signal separation means separates the first or the second synchronization signal from the received image signal and outputs the first or the second synchronization signal at the signal output terminal. Hence, it is possible to suppress a noise or the like in an easy manner in outputting the synchronization signal from the integrated circuit device.

In the fourth aspect of the present invention, the switch means receives the first to the sixth chrominance signals which are supplied to the first to the sixth input terminal, respectively, and selects and outputs either the first to the third chrominance signals or the fourth to the sixth chrominance signals in accordance the switch signal which is supplied to the control terminal. The signal separation means receives either one of the first and the second image signals at the high impedance input terminal, filters off a high-frequency component including the maximum frequency of the received chrominance signal and outputs a signal component which belongs to the frequency band which is related to the first and the second synchronization signals at the output terminal. The amplification means amplifies the image signal which is outputted by the switch means. Since these switch means, the signal separation means and the amplification means are formed on the same integrated circuit substrate and since the input impedance of the signal separation means is sufficiently higher than the output impedance of the switch means, it is easy to transmit the signal from the switch means to amplification means without removing the maximum frequency component of the image signals supplied to the first and the second input terminals. In addition, since the maximum frequency of the chrominance signal is filtered off by the signal separation means, it is possible to suppress a noise or the like in outputting the synchronization signal from the integrated circuit device.

In the fifth aspect of the present invention, the switch means receives the first to the sixth chrominance signals which are supplied to the first to the sixth input terminal, respectively, selects either the first to the third chrominance signals or the fourth to the sixth chrominance signals in accordance the switch signal which is supplied to the control terminal and outputs the selected chrominance signals at the first to the third chrominance signal output terminals. At the high impedance input terminal, the signal separation means receives the chrominance signals which are outputted at the third chrominance signal output terminals of the switch means. The signal separation means then filters off a high-frequency component including the maximum frequency of the received chrominance signals and outputs a signal component which belongs to the frequency band which is related to the first and the second synchronization signals at the output terminal. The amplification means amplifies the image signal which is outputted by the switch means. Since these switch means, the signal separation means and the amplification means are formed on the same integrated circuit substrate and since the input impedance of the signal separation means is sufficiently higher than the output impedance of the switch means, it is easy to transmit the signal from the switch means to amplification means without removing the maximum frequency component of the image signals supplied to the first and the second input terminals. In addition, since the maximum frequency of the chrominance signals is filtered off by the signal separation means, it is possible to suppress a noise or the like in outputting the synchronization signal from the integrated circuit device.

The first synchronization signal may be included in the first chrominance signal of the first image signal, or may be other signal from the first chrominance signal. In the latter case, an eighth input terminal is further disposed as an input terminal for receiving such a first synchronization signal. Similarly, the second synchronization signal may be included in the fourth chrominance signal of the second image signal, or may not be included in the fourth chrominance signal of the second image signal. The present invention deals with either case.

In the sixth aspect of the present invention, the switch means receives the first and the second image signals which are supplied to the first and the second input terminal, respectively, and outputs either the first or the fourth chrominance signal in accordance the switch signal which is supplied to the control terminal. At the high impedance input terminal, the signal separation means receives the chrominance signal which is outputted at the chrominance signal output terminal of the switch means. The signal separation means then filters off a high-frequency component including the maximum frequency of the received chrominance signals and outputs a signal component which belongs to the frequency band which is related to the first and the second synchronization signals at the output terminal. The amplification means amplifies the image signal which is outputted by the switch means. Since these switch means, the signal separation means and the first amplification means are formed on the same integrated circuit substrate and since the input impedance of the signal separation means is sufficiently higher than the output impedance of the switch means, it is easy to transmit the signal from the switch means to first amplification means without removing the maximum frequency component of the image signals supplied to the first and the second input terminals. In addition, since the maximum frequency of the chrominance signals is filtered off by the signal separation means, it is possible to suppress a noise or the like in outputting the synchronization signal from the integrated circuit device.

As described above, the integrated circuit device of each one of the first to the sixth aspects of the present inventions comprises the switch means which is formed in the integrated circuit substrate for outputting either one of the first and the second image signals in accordance the switch signal. The integrated circuit device also comprises the signal separation means which is formed on the integrated circuit substrate. The high impedance input terminal of the signal separation means is connected to the image signal output terminal of the switch means, and has an input impedance which is sufficiently higher than an output impedance of the switch means. The signal separation means filters off a high-frequency component including the maximum frequency of the received image signal and outputs a signal component which belongs to the frequency band which is related to the first and the second synchronization signals at the output terminal. The integrated circuit device also comprises the amplification means which amplifies the image signal which is outputted by the switch means. Hence, by means of the signal separation means in combination with the switch means which selects two or more sets of high-band image signals which is formed in the integrated circuit substrate in which the amplification means are formed, it is easy to manufacture an integrated circuit device in which an image signal is transmitted to the amplification means without deteriorating frequency characteristics of the image signal, and it is possible to reduce external high frequency-induced disturbance.

Accordingly, it is an object of the present invention to offer an inexpensive integrated circuit device in which it is possible to select, amplify and output one of image signals which are inputted without deterioration of signal characteristics by means of provision of a switch circuit and a preamp together on one chip and in which it is possible to separate and output a signal which includes a synchronization signal while suppressing adverse influence of external signal processing.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram of a portion of a display apparatus according to a first preferred embodiment of the present invention;

FIG. 9 is a circuitry diagram for explaining a structure of a separation circuit according to the second preferred embodiment of the present invention;

FIG. 12 is a circuitry diagram for explaining a structure of a separation circuit according to the fourth preferred embodiment of the present invention;

FIGS. 13A and 13B are waveform diagrams for explaining an operation of the separation circuit of FIG. 12;

FIG. 17 is a block diagram partially showing the inside of a conventional display apparatus.

DESCRIPTION OF THE PREFERRED EMBODIMENTS

First Preferred Embodiment

Figure 2A:
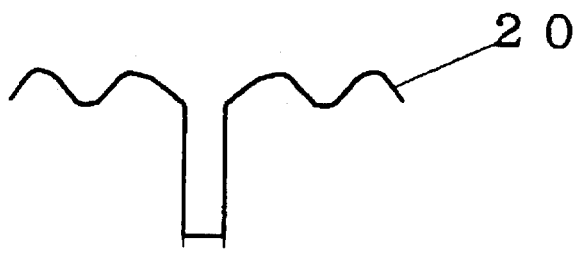
FIG. 2 is a waveform diagram for explaining an operation of the display apparatus of FIG. 1.
Figure 2B:
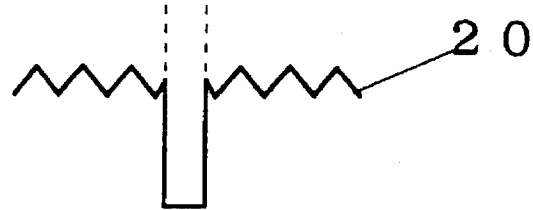
Figure 2C:
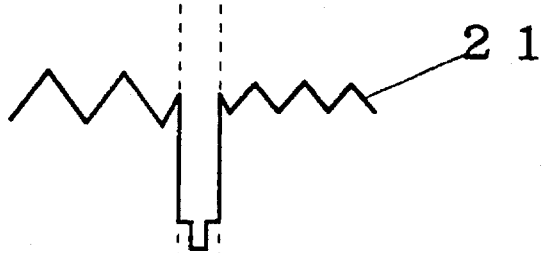
Figure 2D:
Figure 2E:
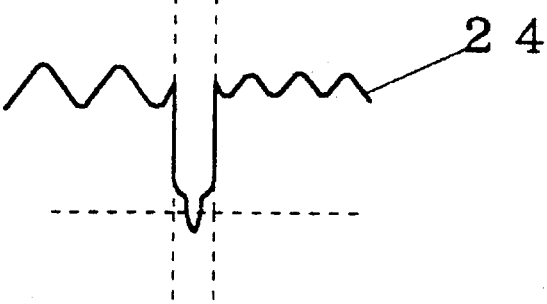

In the following, integrated circuit devices for processing image signals according to the present invention will be described with reference to the drawings. FIG. 1 is a block diagram of a display apparatus which includes an integrated circuit device for processing an image signal according to a first preferred embodiment of the present invention. In FIG. 1, indicated at 1 is a connector of the display apparatus for receiving signals $R_1$, $B_1$ and $G_1$, and indicated at 2 is a connector of the display apparatus for receiving signals $R_2$, $B_2$ and $G_2$. The connector 1 includes three input terminals 1a, 1b and 1c at which the signals $R_1$, $B_1$ and $G_1$ are received, respectively. The connector 2 includes three input terminals 2a, 2b and 2c at which the signals $R_2$, $B_2$ and $G_2$ are received, respectively.

Capacitors c1, c2 and c3 are connected to the input terminals 1a, 1b and 1c, respectively, to cut direct current components of the signals $R_1$, $B_1$ and $G_1$ which are supplied to the input terminals 1a, 1b and 1c. Capacitors c4, c5 and c6 are connected to the input terminals 2a, 2b and 2c, respectively, to cut direct current components of the signals $R_2$, $B_2$ and $G_2$ which are supplied to the input terminals 2a, 2b and 2c. Indicated at 3 is the integrated circuit device for processing an image signal which is formed on one chip. Receiving a plurality of image signals (i.e., the signals $R_1$, $B_1$ and $G_1$ and the signals $R_2$, $B_2$ and $G_2$), the integrated circuit device 3 selects, amplifies and outputs one of the image signals while separating and outputting a signal which includes a synchronization signal.

The integrated circuit device 3 includes input terminals 3a, 3b and 3c which are respectively connected to the input terminals 1a, 1b and 1c through the capacitors c1, c2 and c3 to receive image signals from the connector 1, input terminals 3d, 3e and 3f which are respectively connected to the input terminals 1a, 1b and 1c through the capacitors c4, c5 and c6 to receive image signals from the connector 2, an input terminal 3g for receiving a control signal which selects the received image signals, output terminals 3k, 3m and 3n for outputting amplified image signals, and an output terminal 3p for separating a signal Gb from the signal G and outputting the signal Gb.

The integrated circuit device 3 also includes a switch circuit 4 for selecting one of the image signals which are received at the input terminals 3a and 3d, 3b and 3e, and 3c and 3f under the control of the control signal which is supplied to the input terminal 3g, preamp parts 5 to 7 for amplifying the image signals which are selected by the switch circuit 4 for the respective color signals and outputting the amplified signals at the output terminals 3k to 3n, and a separation circuit 8 which has an input impedance sufficiently higher than an output impedance of the switch circuit 4. The separation circuit 8 separates and processes the color signal which includes the synchronization signal so that no adverse effect will be created, and outputs the processed signal Gb at the output terminal 3p.

In FIG. 1, indicated at 9 is a deflection circuit. From the synchronization signal included in the signal Gb outputted at the output terminal 3p of the integrated circuit device 3, the deflection circuit 9 generates a current which horizontally and vertically deflects an electron beam which is used for displaying an image on a screen. Noted at 10 is a synchronization separator for separating the synchronization signal from the signal Gb which is supplied to the deflection circuit 9. Indicated at 11 is a horizontal deflection circuit for generating a sawtooth current used for horizontal deflection from the synchronization signal which is outputted by the synchronization separator 10. Indicated at 12 is a vertical deflection circuit for generating a sawtooth current used for vertical deflection from the synchronization signal which is outputted by the synchronization separator 10. Indicated at 14, 15 and 16 are poweramp parts for amplifying and outputting the signals R, B and G which are amplified by the preamp parts 5, 6 and 7, respectively. Indicated at 17 is a CRT which is connected to the poweramp parts 14 to 16 and the deflection circuit 9 to display the image signals. The CRT 17 includes electron beam guns 17a to 17c for emitting electron beams under the control of outputs of the poweramp parts 14 to 16, a horizontal deflection coil for horizontally deflecting the electron beams under the control of an output of the horizontal deflection circuit 11, and a vertical deflection coil for vertically deflecting the electron beams under the control of an output of the vertical deflection circuit 12.

In the display apparatus of FIG. 1, the integrated circuit device 3 is formed by only one IC which is capable of simultaneously processing the signals R, G and B. The poweramp parts 14 to 16 and the deflection circuit 9 are formed by independently of the integrated circuit device 3 (hereinafter simply "preamp IC"). In this display apparatus, the switch circuit 4 and the separation circuit 8 are integrated in the preamp IC 3. The preamp IC 3 also integrates the synchronization separating output terminal 3p at which the signal Gb separated by the separation circuit 8 is outputted.

Now, a description will be given on an operation of the preamp IC 3 when image signals are supplied to the connector 1 from a computer but image signals are not supplied to the connector 2. FIG. 2 is a waveform diagram of signals which are supplied to the input terminals 3a to 3d. In FIG. 2, noted at 20 is the signal $R_1$ which is supplied to the input terminal 3a, noted at 21 is the signal $B_1$ which is supplied to the input terminal 3b, noted at 22 is the signal $G_1$ which is supplied to the input terminal 3c, noted at 23 is the signals $R_2$, $B_2$ and $G_2$ which are supplied to the input terminals 3d, 3e and 3f, respectively, and noted at 24 is the signal Gb which is outputted at the output terminal 3p.

When the control signal is supplied to the switch circuit 4 from the input terminal 3g, by switching operations of the switch circuit 4, the signals $R_1$, $B_1$ and $G_1$ or the signals $R_2$, $B_2$ and $G_2$ are selected so that the signals 20, 21 and 22 are supplied to the preamp parts 5, 6 and 7, respectively. Here, the signal $G_1$ as that shown in FIG. 2 is supplied to the separation circuit 8 since the separation circuit 8 is connected to the input terminal 3c. The preamp parts 5 to 7 are connected directly to the switch circuit 4. Since the separation circuit 8 is connected to an input of the preamp part 7 so as to supply the signal $G_1$ only to the separation circuit 8, by constructing the separation circuit 8 to have a high input impedance, an output of the separation circuit 8 and other signals are in a balance. For example, if an output impedance of the switch circuit 4 is 10Ω, it is desirable that the separation circuit 8 has an input impedance a hundred times as high as or higher than the output impedance of the switch circuit 4, i.e., an input impedance of 1 kΩ or more.

The preamp IC 3 integrates the synchronization separating output terminal 3p at which the signal Gb separated by the separation circuit 8 is outputted. Supplied to the separation circuit 8, the signal 22 is processed to filter off high-frequency components including the maximum frequency of the signal $G_1$, whereby the signal 22 is converted into the signal 24 and outputted at the output terminal 3p. As can be seen in FIG. 2, the waveform of the signal 24 is not sharp due to the absence of high-frequency components. The signal 24 having such a waveform is then supplied to the synchronization separator 10 of the deflection circuit 9.

Since the switch circuit 4 and the separation circuit 8 are integrated in the preamp IC 3, connection lines from the switch circuit 4 to the preamp parts 5 to 7 are short and a driving current is accordingly small. For the same reason, an undesirable influence of the signal 24 within and outside the preamp IC 3 is reduced, e.g., the signal Gb is prevented from getting superimposed as a noise on the signal 24 which is outputted at the output terminal 3p. With respect to the signal G, since the signal G is coupled to the output terminal through a buffer, impedance matching designs at the connections between the switch circuit and the preamp parts may be exactly the same. Further, there is no need to transfer all high-frequency components for synchronization separating of the signal G. In most cases, a cycle of up to 100 KHz is sufficient as the pulse cycle of the synchronization signal, and a frequency component of up to 1 MHz is sufficient as the frequency component of a signal which is supplied to the synchronization separator 10. The separation circuit 8 only needs to have a driving capability to output such a frequency component, and therefore, disturbance external of the IC is suppressed.

Figure 3:
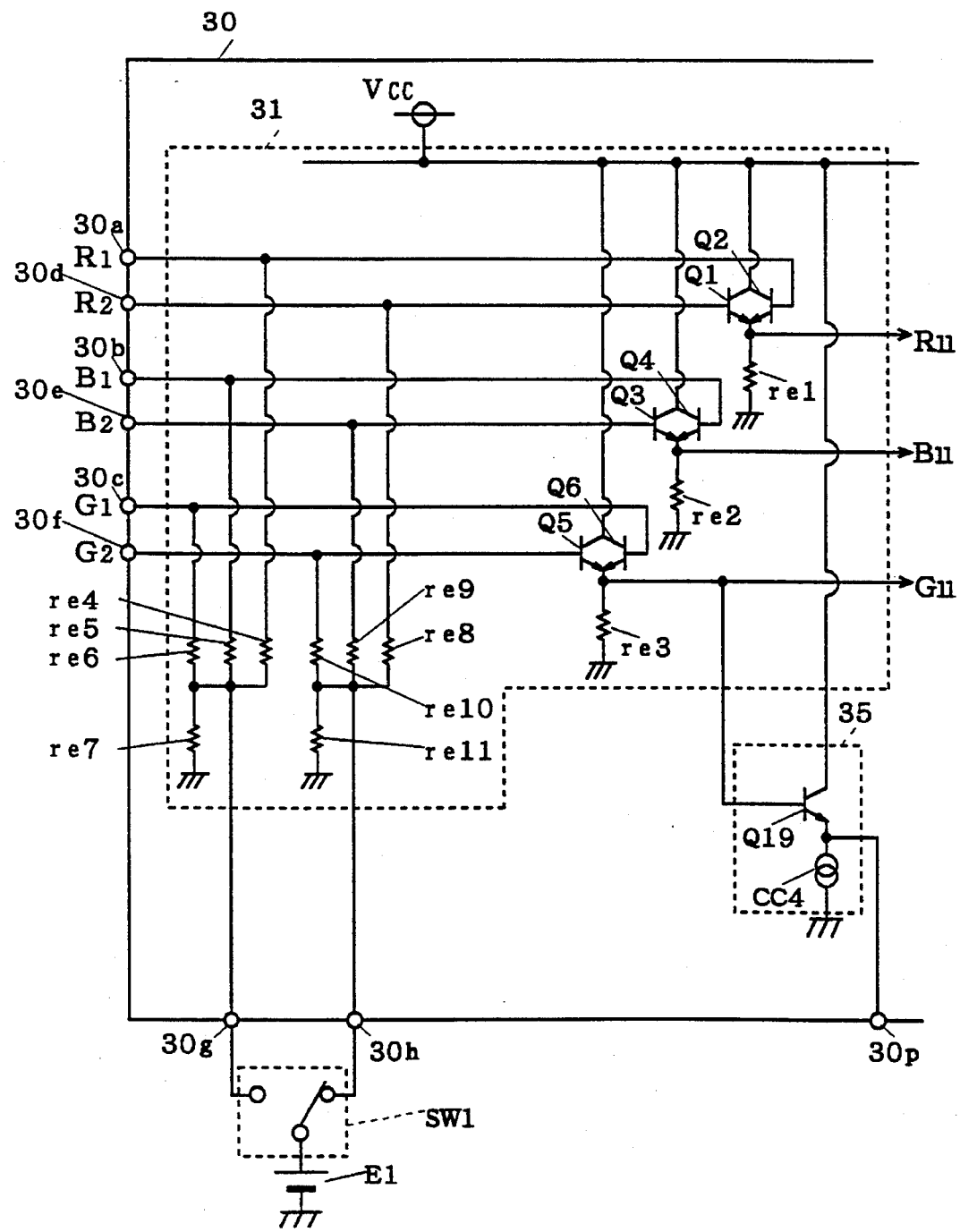
FIGS. 3 and 4 are circuitry diagrams for explaining a structure of the display apparatus of the first preferred embodiment of the present invention.
Figure 4:
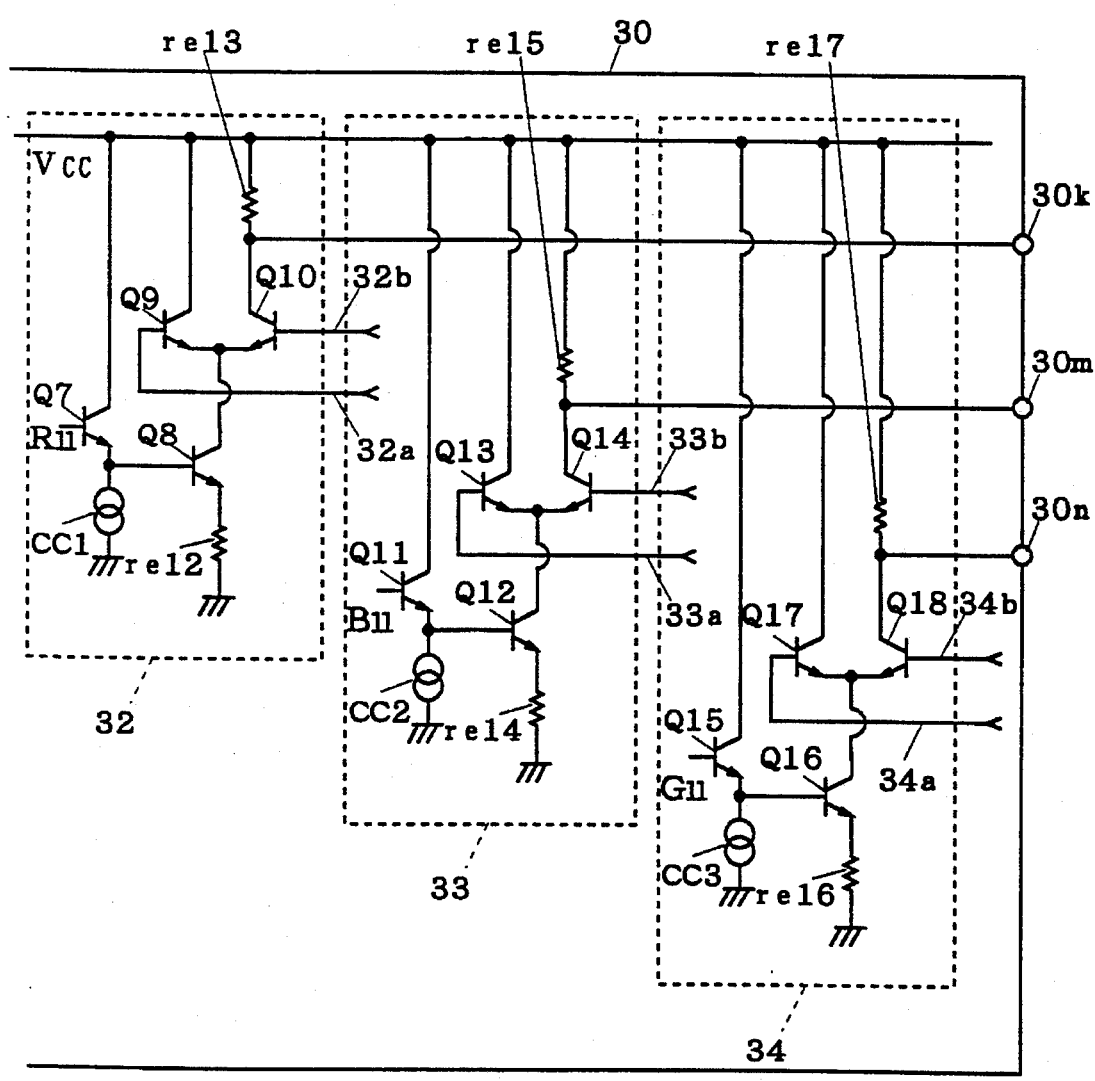

Next, the structure of the integrated circuit device will be described in detail with reference to FIGS. 3 and 4. FIGS. 3 and 4 are circuitry diagrams showing one aspect of the integrated circuit device for processing an image signal according to the first preferred embodiment of the present invention. In FIGS. 3 and 4, the integrated circuit device 30 is formed on one chip. Receiving a plurality of image signals (i.e., the signals $R_1$, $B_1$ and $G_1$ and the signals $R_2$, $B_2$ and $G_2$), the integrated circuit device 30 selects, amplifies and outputs one of the image signals while separating and outputting a signal which includes a synchronization signal. FIGS. 3 and 4 should be taken as combined with each other since the integrated circuit device 30, although formed on one substrate, is too large to illustrate in one figure.

The integrated circuit device 30 includes input terminals 30a, 30b and 30c for respectively receiving the signals $R_1$, $B_1$ and $G_1$, input terminals 30d, 30e and 30f for respectively receiving the signals $R_2$, $B_2$ and $G_2$, input terminals 30g and 30h for respectively receiving control signals which select a plurality of image signals, output terminals 30k, 30m and 30n for outputting amplified image signals, and an output terminal 30p for outputting the signal Gb which is separated from the signal G.

The integrated circuit device 30 also includes a switch circuit 31 for selecting one of the image signals which are received at the input terminals 30a and 30d, 30b and 30e, and 30c and 30f under the control of the control signal which is supplied to the input terminal 30g, preamp parts 32 to 34 for amplifying the image signals which are selected by the switch circuit 31 for the respective color signals and outputting the amplified signals at the output terminals 30k to 30n, and a separation circuit 35 which has an input impedance sufficiently higher than an output impedance of the switch circuit 31. The separation circuit 35 separates and processes the color signal which includes the synchronization signal so that no adverse effect will be created, and outputs the processed signal Gb at the output terminal 30p.

In FIGS. 3 and 4, noted at SW1 is a switch for connecting a direct current source E1 to either one of the input terminals 30g and 30h and for selecting image signals. The switch circuit 31 is formed by NPN transistors Q1 to Q6 and resistors re1 to re11. The NPN transistors Q1 and Q2 both receive a power source voltage $V_{cc}$ at their collectors, and have their emitters connected to one end of the resistor re1. A base of the NPN transistor Q1 is connected to the input terminal 30d while a base of the NPN transistor Q2 is connected to the input terminal 30a. The other end of the resistor re1 is coupled to a ground potential. A signal $R_{11}$ is available from the one end of the resistor re1.

The NPN transistors Q3 and Q4 both receive the power source voltage $V_{cc}$ at their collectors, and have their emitters connected to one end of the resistor re2. A base of the NPN transistor Q3 is connected to the input terminal 30e while a base of the NPN transistor Q4 is connected to the input terminal 30b. The other end of the resistor re2 is grounded. A signal $B_{11}$ is available from the one end of the resistor re2.

The NPN transistors Q5 and Q6 both receive the power source voltage $V_{cc}$ at their collectors, and have their emitters connected to one end of the resistor re3. A base of the NPN transistor Q5 is connected to the input terminal 30f while a base of the NPN transistor Q6 is connected to the input terminal 30c. The other end of the resistor re3 is grounded.

The resistors re4, re5, re6, re8, re9 and re10 have their one ends connected to the input terminals 30a, 30b, 30c, 30d, 30e and 30f, respectively. The resistors re4 to re6 have their other ends connected commonly to the input terminal 30g while the resistors re8 to re10 have their other ends connected commonly to the input terminal 30h. One end of the resistor re7 is connected to the input terminal 30g and one end of the resistor re11 is connected to the input terminal 30h. One end of the resistor re7 is connected to the input terminal 30g while one end of the resistor re11 is connected to the input terminal 30h. Other ends of the resistors re7 and re11 are both grounded. A signal $G_{11}$ is available from the one end of the resistor re3.

The preamp part 32 is formed by NPN transistors Q7 to Q10, resistors re12 and re13 and a constant current source cc1 which provides a constant current which has a predetermined value.

The NPN transistor Q7 has its base connected to the one end of the resistor re1, receives the power source voltage $V_{cc}$ at its collector and has its emitter connected to an input terminal of the constant current source cc1. The signal $R_{11}$ is supplied to the base of the NPN transistor Q7. An output terminal of the constant current source cc1 is grounded. The NPN transistor Q8 has its base connected to the emitter of the NPN transistor Q7 and has its emitter connected to one end of the resistor re12. The other end of the resistor re12 is grounded. The NPN transistor Q9 receives a voltage 32a which controls a gain at its base, receives the power source voltage $V_{cc}$ at its collector and has its emitter connected to a collector of the NPN transistor Q8. The power source voltage $V_{cc}$ is applied on one end of the resistor re13. The NPN transistor Q10 receives a voltage 32b which controls a gain at its base, has its emitter connected to the collector of the NPN transistor Q8 and has its collector connected to the other end of the resistor re13. The other end of the resistor re13 is connected to the output terminal 30k.

The preamp part 33 is formed by NPN transistors Q11 to Q14, resistors re14 and re15 and a constant current source cc2.

The NPN transistor Q11 has its base connected to the one end of the resistor re2, receives the power source voltage $V_{cc}$ at its collector and has its emitter connected to an input terminal of the constant current source cc2. An output terminal of the constant current source cc2 is grounded. The signal $B_{11}$ is supplied to a base of the NPN transistor Q11. The NPN transistor Q12 has its base connected to the emitter of the NPN transistor Q11 and its emitter connected to one end of the resistor re14. The other end of the resistor re12 is grounded. The NPN transistor Q13 receives a voltage 33a which controls a gain at its base, receives the power source voltage $V_{cc}$ at its collector and has its emitter connected to a collector of the NPN transistor Q12. The power source voltage $V_{cc}$ is applied on one end of the resistor re15. The NPN transistor Q14 receives a voltage 33b which controls a gain at its base, has its emitter connected to the collector of the NPN transistor Q12 and has its collector connected to the other end of the resistor re15. The other end of the resistor re15 is connected to the output terminal 30m.

The preamp part 34 is formed by NPN transistors Q15 to Q18, resistors re16 and re17 and a constant current source cc3.

The NPN transistor Q15 has its base connected to the one end of the resistor re3, receives the power source voltage $V_{cc}$ at its collector and has its emitter connected to an input terminal of the constant current source cc3. An output terminal of the constant current source cc3 is grounded. The signal $G_{11}$ is supplied to a base of the NPN transistor Q15. The NPN transistor Q16 has its base connected to the emitter of the NPN transistor Q15 and its emitter connected to one end of the resistor re16. The other end of the resistor re16 is grounded. The NPN transistor Q17 receives a voltage 34a which controls a gain at its base, receives the power source voltage $V_{cc}$ at its collector and has its emitter connected to a collector of the NPN transistor Q16. The power source voltage $V_{cc}$ is applied on one end of the resistor re17. The NPN transistor Q18 receives a voltage 34b which controls a gain at its base, has its emitter connected to the collector of the NPN transistor Q18 and has its collector connected to the other end of the resistor re17. The other end of the resistor re17 is connected to the output terminal 30n.

The separation circuit 35 is formed by an NPN transistor Q19 and a constant current source cc4. The NPN transistor Q19 has its base connected to the one end of the resistor re3, receives the power source voltage $V_{cc}$ at its collector, and has its emitter connected to the output terminal 30p. One end of the constant current source cc4 is connected to the emitter of the NPN transistor Q19 and the other end is grounded.

The separation circuit 35 has the simplest possible signal separating structure. The NPN transistor Q19 and the constant current source cc4 form an emitter follower which has a high input impedance. Hence, by setting the current value of the constant current source cc4 at an appropriate value, the integrated circuit device is completed such that the maximum frequency included in the signal $G_{11}$ is filtered off by a transistor which has a structure as that of the NPN transistor Q5.

Figure 5A:
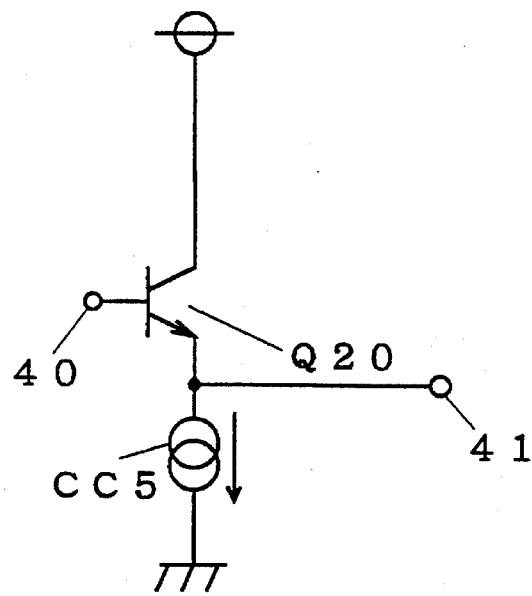
FIGS. 5A and 5B are views for explaining a structure of a separation circuit according to a first aspect of the first preferred embodiment of the present invention.
Figure 5B:
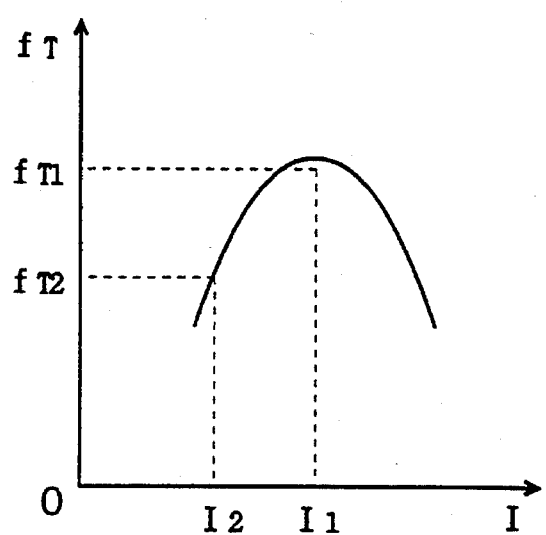

FIGS. 5A and 5B are views for explaining a relation between an emitter current of a regular NPN transistor Q20 having its collector grounded and a cutoff frequency $f_T$ of the NPN transistor Q20. Here, a signal supplied to an input terminal 40 is processed by the NPN transistor Q20 and outputted at an output terminal 41. In processing the signal, the cutoff frequency $f_T$ of the NPN transistor Q20 has a peak value of $f_{T1}$ when a current supplied from a constant current source cc5 is $I_1$. Hence, it is possible to filter off a frequency component which is higher than the cutoff frequency $f_{T2}$ by setting the current supplied by the constant current source cc5 at a current value $I_2$ which is lower than the current value $I_1$.

Figure 6A:
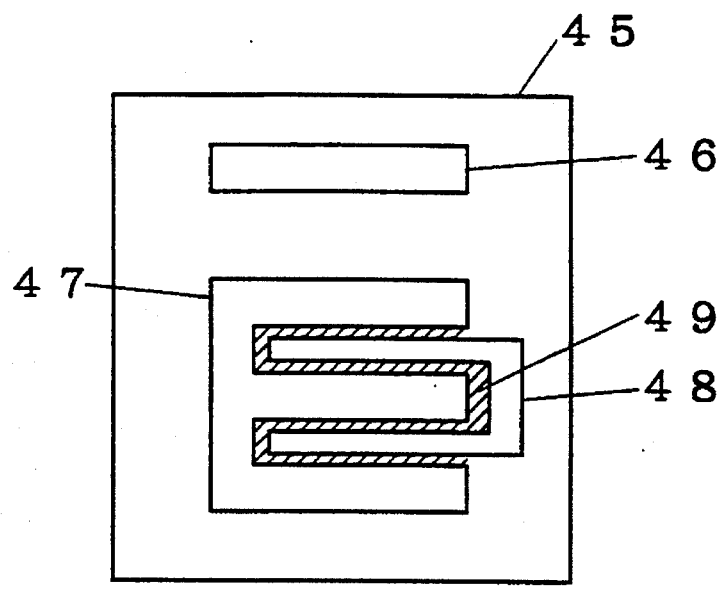
FIGS. 6A and 6B are plan views for explaining a structure of a separation circuit according to a second aspect of the first preferred embodiment of the present invention.
Figure 6B:
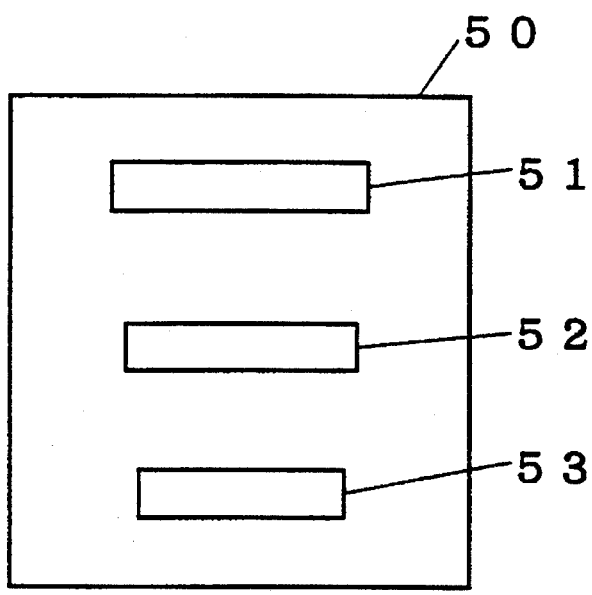

It is possible to filter off the maximum frequency which is included in the signal $G_1$ also by modifying the structure of the NPN transistor Q19. FIGS. 6A and 6B are plan views schematically showing two different transistor structures used in the present invention. In FIG. 6A, noted at 45 is a well, noted at 46 is a collector electrode having a rectangular plan configuration, noted at 47 is a comb-like shaped base electrode having its teeth extending parallel to the collector electrode 46, and noted at 48 is a comb-like shaped emitter electrode which is disposed adjacent to the base electrode 47 so as to have its teeth intermeshed with the teeth of the base electrode 47. Although FIG. 6A shows the base electrode 47 as having two teeth to resemble the letter E, the base electrode 47 may be configured otherwise as far as a hatched portion 49 is large at which the base and the emitter electrodes 47 and 48 face each other. The reason for forming the transistor in a structure as that shown in FIG. 6A is to process a signal which has a frequency higher than the maximum frequency of an image signal. The NPN transistors Q1 to Q6 each have this transistor structure, for instance.

On the other hand, a transistor structure of FIG. 6B is adopted for the NPN transistor Q19. In FIG. 6B, indicated at 50 is a well, indicated at 51 is a collector electrode having a rectangular plan configuration, indicated at 52 is a base electrode having a rectangular plan configuration which is disposed parallel to the collector electrode 51, and indicated at 53 is an emitter electrode having a rectangular plan configuration which is disposed parallel to the base electrode 52 on the opposite side of the collector electrode 51. By forming the NPN transistor Q19 in such a simple structure in which the maximum frequency $f_T$ which can be processed is reduced to be small, it is possible to filter off high-frequency components from a signal to be processed.

Figure 7:
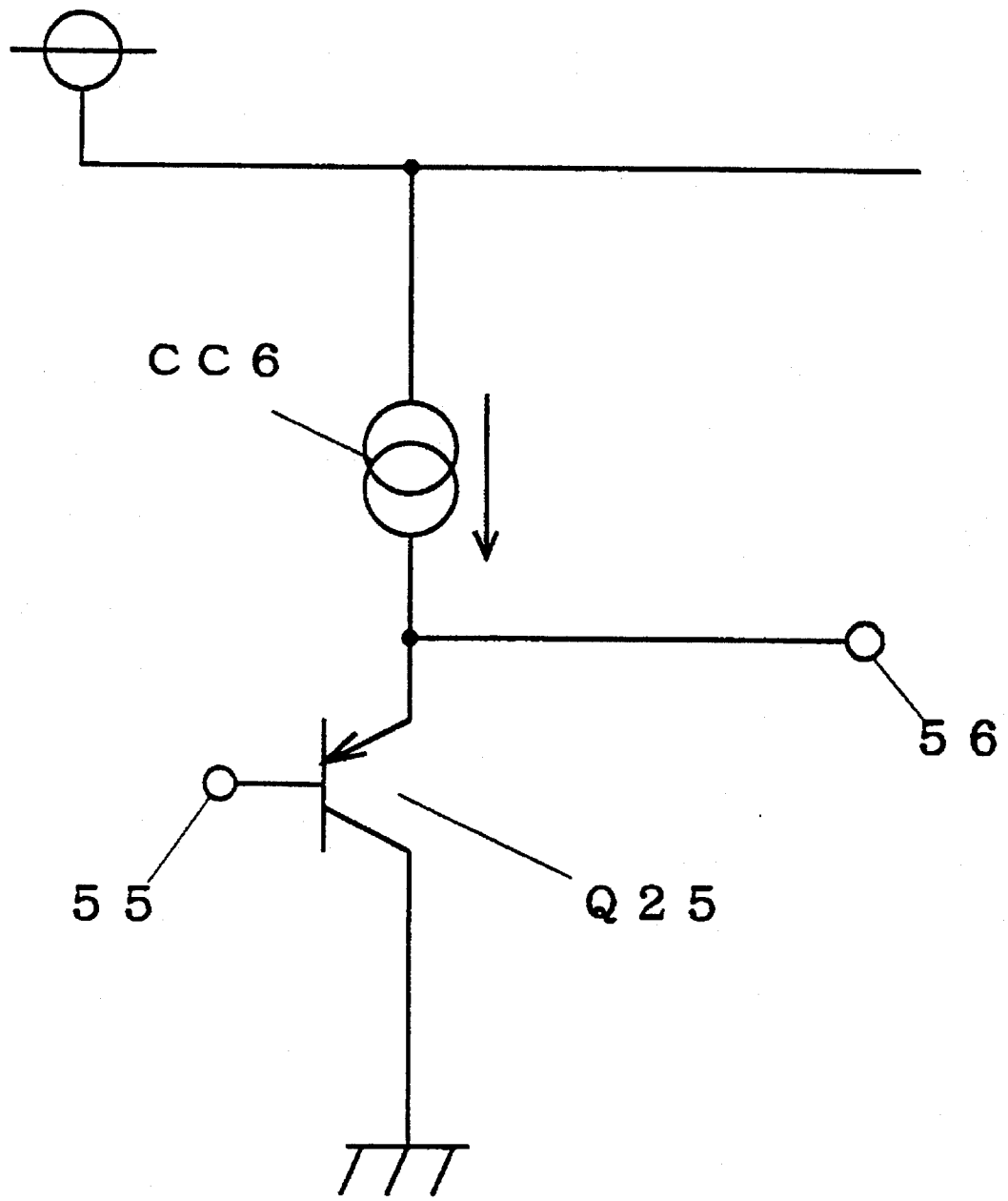
FIG. 7 is a circuitry diagram for explaining a structure of a separation circuit according to a third aspect of the first preferred embodiment of the present invention.

The emitter follower may be formed using a PNP transistor as shown in FIG. 7. Since a cutoff frequency $f_T$ of a PNP transistor is lower than that of an NPN transistor in general, the maximum frequency of the signal G is filtered off if the separation circuit is formed using a PNP transistor. A PNP transistor Q25 has its base connected to an input terminal 55, its collector grounded and its emitter connected to an output terminal 56. The constant current source cc4 has its one end connected to the emitter of the NPN transistor Q19 and its other end grounded. The separation circuit 35 of FIG. 3 may be replaced with this circuit of FIG. 7. That is, the input terminal 55 of the separation circuit which is formed by the PNP transistor Q25 and a constant current source cc6 is connected to the one end of the resistor re3, and the output terminal 56 is connected to the output terminal 30p.

Second Preferred Embodiment

Figure 8:
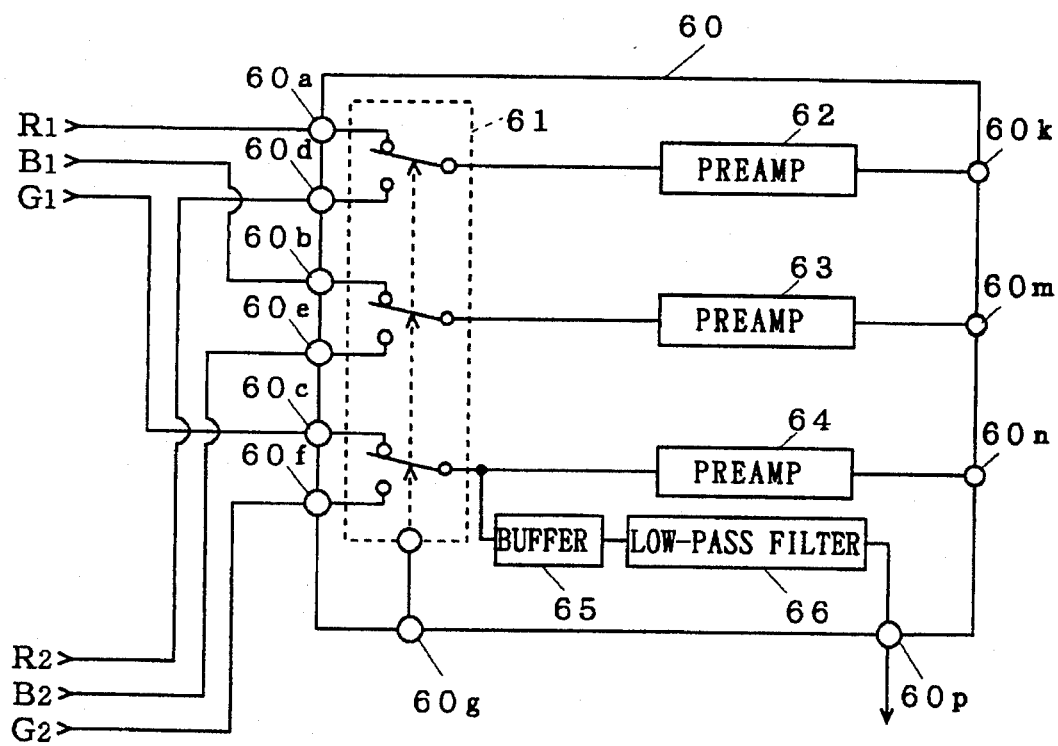
FIG. 8 is a block diagram showing a structure of an integrated circuit device for processing an image signal according to a second preferred embodiment of the present invention.

FIG. 8 is a block diagram showing a structure of an integrated circuit device for processing an image signal according to a second preferred embodiment of the present invention. In FIG. 8, noted at 60 is an integrated circuit device formed on one substrate. An integrated circuit device 60 includes input terminals 60a, 60b and 60c for respectively receiving the signals $R_1$, $B_1$ and $G_1$, input terminals 60d, 60e and 60f for respectively receiving the signals $R_2$, $B_2$ and $G_2$, and an input terminal 60g for receiving a control signal which selects a plurality of image signals. The integrated circuit device 60 is otherwise the same as the display apparatus of FIG. 1 with respect to other components such as the poweramp parts and the deflection circuits.

In the integrated circuit device 60, the switch circuit 61 selects one of image signals which are received at the input terminals 60a and 60d, 60b and 60e, and 60c and 60f under the control of the control signal which is supplied to the input terminal 60g. The integrated circuit device 60 also includes output terminals 60k, 60m and 60n for outputting amplified image signals and preamp parts 62, 63 and 64 which are disposed respectively between the switch circuit 61 and the output terminals 60k, 60m and 60n. The image signals selected by the switch circuit 61 are amplified by the preamp parts 62, 63 and 64 for the respective chrominance signals and outputted at the output terminals 60k, 60m and 60n, respectively.

The integrated circuit device 60 further includes an output terminal 60p for outputting the signal Gb which is separated from the signal G. A buffer 65 and a low-pass filter 66 which are connected in series to each other serve as a separation circuit which has an input impedance which is sufficiently higher than an output impedance of the switch circuit 61. The separation circuit separates and processes a chrominance signal which includes a synchronization signal, suppresses adverse influence and outputs the processed signal Gb at the output terminal 60p. The buffer 65 has an input impedance which is sufficiently higher than the output impedance of the switch circuit 61, e.g., about a hundred times as high as the output impedance of the switch circuit 61 or higher. By connecting such a buffer 65, there is no need to design impedance matching different between the preamp parts 62 to 64. For instance, an emitter follower may be used as the buffer 65.

It is not necessary to transfer all high-frequency components for synchronization separating of the signal G. In most cases, a cycle of up to 100 KHz is sufficient as the pulse cycle of the synchronization signal, and a frequency component of up to 1 MHz is sufficient as the frequency component of a signal which is supplied to the synchronization separator 10. For this reason, high-frequency components which are not related to the synchronization signal are filtered off by the low-pass filter 66, and the separation circuit outputs a filtered signal as an output signal. Therefore, the separation circuit only needs to have a driving capability to output such a frequency component, and hence, disturbance external of the IC is suppressed. In the second preferred embodiment, the low-pass filter 66 disposed before the synchronization separating output terminal 60p which outputs the signal G reduces high frequency-induced disturbance from the output terminal to outside the IC more than in the first preferred embodiment.

FIG. 9 is a circuitry diagram showing an example of a structure of the separation circuit according to the second preferred embodiment. In FIG. 9, noted at 67 is an input terminal which is connected to the switch circuit 61, noted at Q26 is an NPN transistor having its base connected to the input terminal 67, its collector for receiving the power source voltage $V_{cc}$ and its emitter for outputting an output signal, noted at cc7 is a constant current source having its one end connected to the emitter of the NPN transistor Q26 and its other end grounded, noted at re20 is a resistor having its one end connected to the emitter of the NPN transistor Q26 and its other end connected to an output terminal 68, and noted at c7 is a capacitor having its one electrode connected to the output terminal 68 and its other electrode grounded.

The NPN transistor Q26 and the constant current source cc7 form the buffer 65 while the resistor re20 and the capacitor c7 form the low-pass filter 66. The effect as described above is achieved even if the buffer 65 and the low-pass filter 66 each have other structure.

Third Preferred Embodiment

Figure 10:
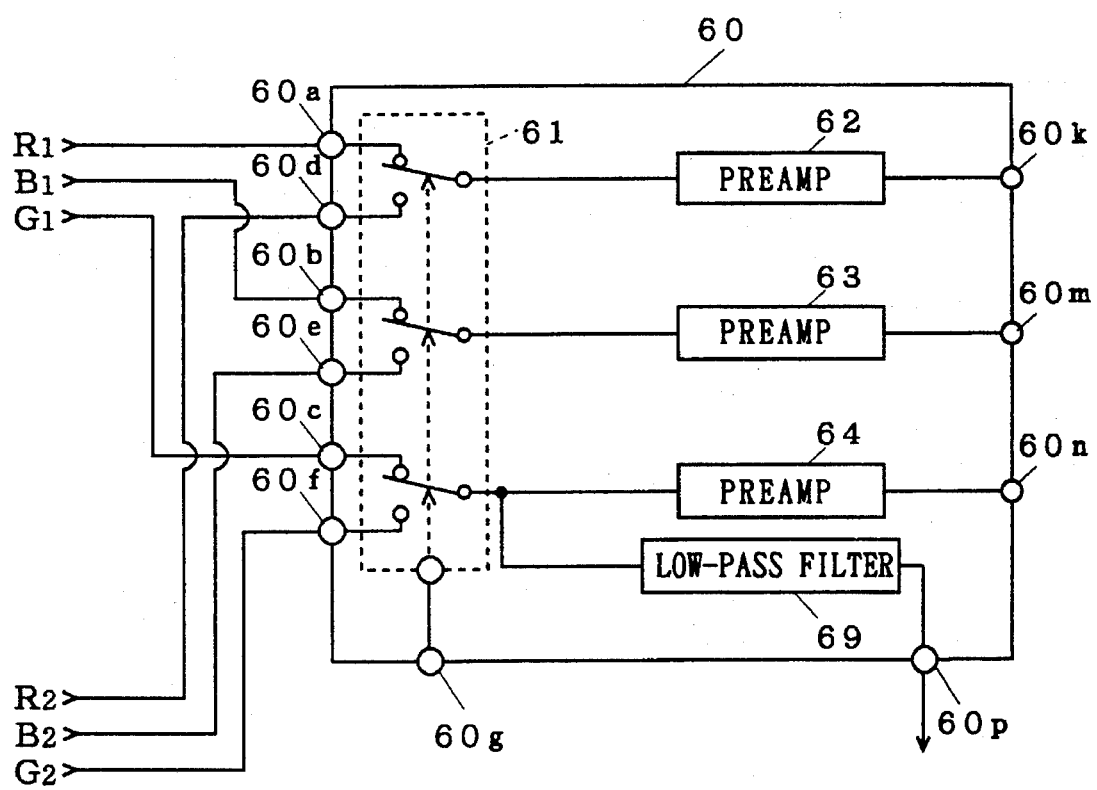
FIG. 10 is a block diagram showing a structure of an integrated circuit device for processing an image signal according to a third preferred embodiment of the present invention.

FIG. 10 is a block diagram showing a structure of an integrated circuit device for processing an image signal according to a third preferred embodiment of the present invention. In FIG. 10, indicated at 69 is a low-pass filter having a high input impedance. With respect to FIG. 10, parts similar to those previously described with reference to FIG. 9 are denoted by the same reference numerals. The low-pass filter 69 filters off the maximum frequency of the signal G. Removal of the maximum frequency of the signal G has no influence over the synchronization signal. Thus, if formed using the low-pass filter 69, the separation circuit has a driving capability which is just large enough to output a frequency component of the synchronization signal, and therefore, disturbance external of the IC is suppressed to be small. The low-pass filter 69 disposed before the synchronization separating output terminal 60p which outputs the signal G reduces high frequency-induced disturbance from the output terminal to outside the IC more than in the first preferred embodiment. The low-pass filter 69 has an input impedance which is sufficiently higher than the output impedance of the switch circuit 61, e.g., preferably about a hundred times as high as the output impedance of the switch circuit 61 or higher. If the input impedance of the low-pass filter is high, the buffer 65 as that shown in FIG. 9 is unnecessary.

Fourth Preferred Embodiment

Figure 11:
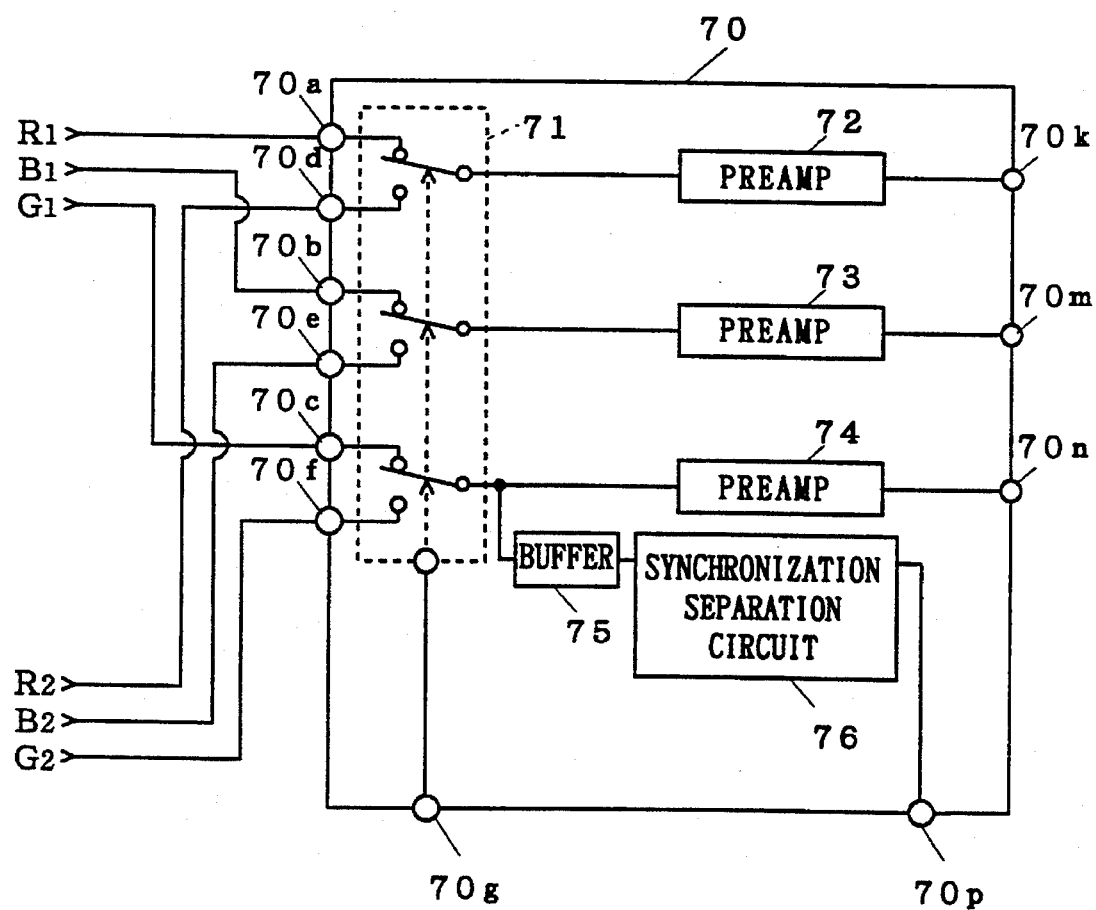
FIG. 11 is a block diagram showing a structure of an integrated circuit device for processing an image signal according to a fourth preferred embodiment of the present invention.

FIG. 11 is a block diagram showing a structure of an integrated circuit device for processing an image signal according to a fourth preferred embodiment of the present invention. In FIG. 11, indicated at 70 is an integrated circuit device which is formed on one substrate. The integrated circuit device 70 includes input terminals 70a, 70b and 70c for respectively receiving the signals $R_1$, $B_1$ and $G_1$, input terminals 70d, 70e and 70f for respectively receiving the signals $R_2$, $B_2$ and $G_2$, and an input terminal 70g for receiving a control signal which selects a plurality of image signals. The poweramp parts, the deflection circuit and the like are disposed with respect to the integrated circuit device 70 in a manner similar to that for the display apparatus of FIG. 1.

In the integrated circuit device 70, a switch circuit 71 selects one of image signals which are received at the input terminals 70a and 70d, 70b and 70e, and 70c and 70f under the control of the control signal which is supplied to the input terminal 70g. The integrated circuit device 70 also includes output terminals 70k, 70m and 70n for outputting amplified image signals and preamp parts 72, 73 and 74 which are disposed respectively between the switch circuit 71 and the output terminals 70k, 70m and 70n. The image signals selected by the switch circuit 71 are amplified by the preamp parts 72, 73 and 74 for the respective chrominance signals and outputted at the output terminals 70k, 70m and 70n, respectively.

The integrated circuit device 70 further includes an output terminal 70p for outputting the signal Gb which is separated from the signal G. A buffer 75 and a synchronization separator 76 which are connected in series to each other serve as a separation circuit which has an input impedance which is sufficiently higher than an output impedance of the switch circuit 71. The separation circuit separates and processes a chrominance signal which includes a synchronization signal, suppresses adverse influence and outputs the processed signal Gb at the output terminal 70p. The buffer 75 has an input impedance which is sufficiently higher than the output impedance of the switch circuit 71, e.g., about a hundred times as high as the output impedance of the switch circuit 71 or higher. By connecting such a buffer 75, there is no need to design impedance matching different between the preamp parts 72 to 74. For instance, an emitter follower may be used as the buffer 75.

The synchronization separator 76 separates the synchronization signal. Since the pulse cycle of the synchronization signal is up to 100 KHz in general, the separation circuit separates the synchronization signal from the signal G and outputs the same at the output terminal 70p. By disposing the synchronization separator 76 before the synchronization separating output terminal 70p of the preamp IC a frequency components of the signal outputted at the output terminal 70p is suppressed, which in turn reduces high frequency-induced disturbance from the output terminal to outside the IC more than in the second preferred embodiment.

FIG. 12 is a circuitry diagram showing an example of a structure of the separation circuit according to the fourth preferred embodiment. In FIG. 12, noted at 77 is an input terminal which is connected to the switch circuit 71, noted at Q27 is an NPN transistor having a base which is connected to the input terminal 77, a collector for receiving the power source voltage $V_{cc}$ and an emitter for outputting an output signal S1, noted at cc8 is a constant current source having its one end connected to the emitter of the NPN transistor Q27 and its other end grounded, noted at cc9 is a constant current source having an input terminal and an output terminal which is grounded, noted at Q28 is an NPN transistor having a collector for receiving the power source voltage $V_{cc}$, a base connected to the emitter of the NPN transistor Q27 and an emitter connected to the input terminal of the constant current source cc9, noted at re21 is a resistor having one end for receiving the power source voltage $V_{cc}$ and other end connected to an output terminal 78, and noted at Q29 is an NPN transistor having its collector connected to the other end of the resistor re21, its base fixed at a predetermined voltage by means of the direct current source E2 and its emitter connected to the input terminal of the constant current source cc9.

The NPN transistor Q27 and the constant current source cc8 form the buffer 75 while the resistor re21, the NPN transistors Q28 and Q29 and the constant current source cc9 form the synchronization separator 76. FIGS. 13A and 13B are waveform diagrams for explaining an operation of the circuit of FIG. 12. In FIGS. 13A and 13B, noted at 80 is the signal S1 and noted at 81 is a signal S2. The signal G which includes the synchronization signal is supplied to the input terminal 77, passed through the NPN transistor Q27 and outputted at the emitter of the NPN transistor Q27. The buffer 75, which is formed by the NPN transistor Q27 and the constant current source cc8, is an emitter follower and hence has a high input impedance. A signal outputted at the emitter of the NPN transistor Q27 is the signal S1. The signal S1 is compared with a reference voltage $V_x$ which is determined by the direct current source E2. Only a portion of the synchronization signal which has a voltage lower than the reference voltage $V_x$ is outputted at the output terminal 78 as the signal S2. The effect as described above is achieved even if the buffer 75 and the synchronization separator 76 each have other structure.

Fifth Preferred Embodiment

Figure 14:
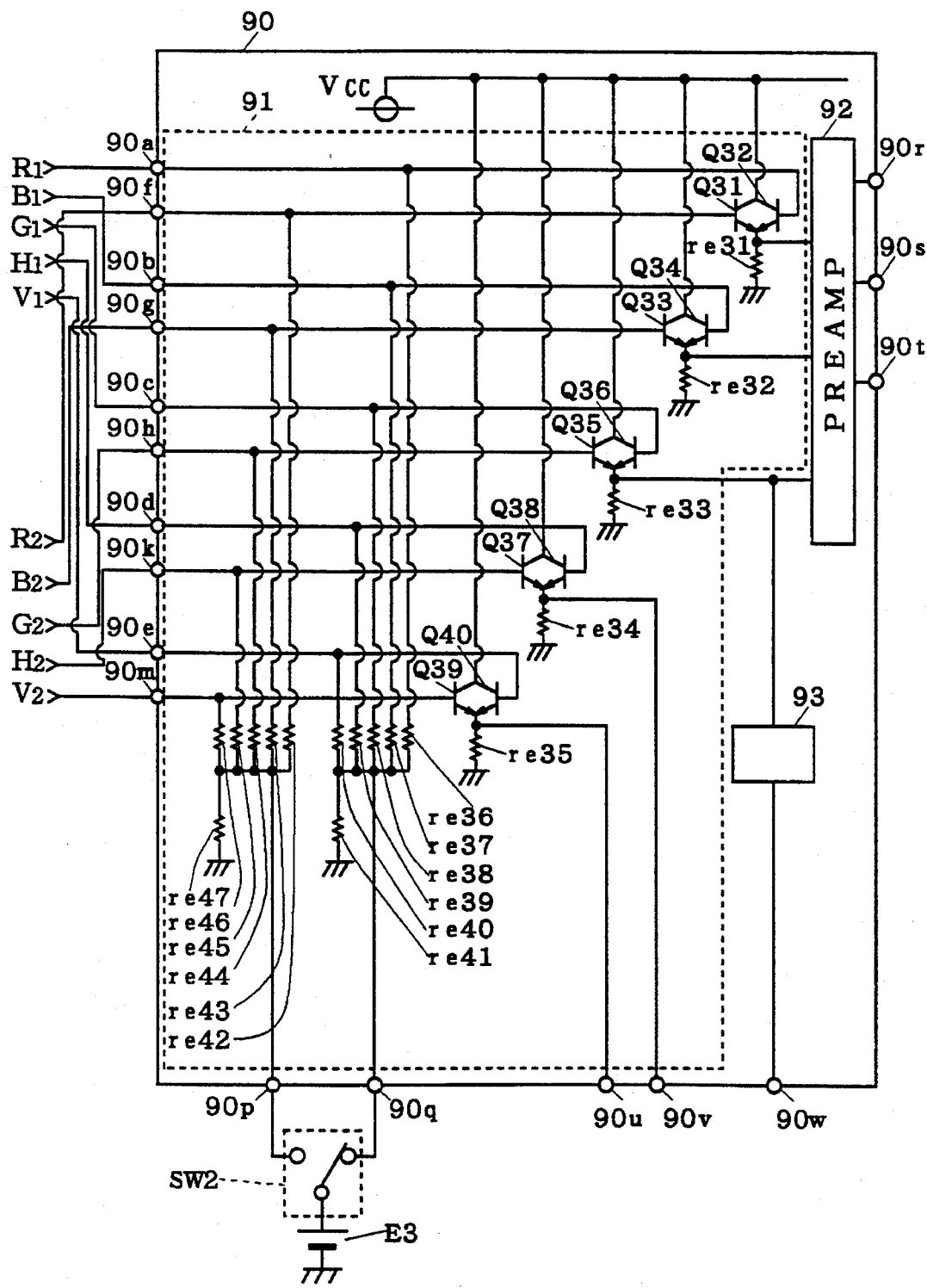
FIG. 14 is a block diagram showing a structure of an integrated circuit device for processing an image signal according to a fifth preferred embodiment of the present invention.

Now, a fifth preferred embodiment of the present invention will be described with reference to FIG. 14. FIG. 14 is a view of an integrated circuit device for processing an image signal according to the fifth preferred embodiment of the present invention. As mentioned earlier, the synchronization signal is outputted on another line from a computer in some cases. The integrated circuit device of the fifth preferred embodiment shown in FIG. 14 is equivalent to the integrated circuit device of the first preferred embodiment shown in FIG. 3 as it is modified to further include a switch circuit for switching synchronization signals. In FIG. 14, indicated at 91 is a switch circuit, indicated at 92 is a preamp part, indicated at 93 is a separation circuit, indicated at Q3 to Q40 are NPN transistors which form the switch circuit 91, and indicated at re31 to re47 are resistors which form the switch circuit 91. The switch circuit 91 is comprised of transistors and resistors like the switch circuit 31 of FIG. 3.

Two different types of horizontal synchronization signals $H_1$ and $H_2$ and two different types of vertical synchronization signals $V_1$ and $V_2$ are supplied to a preamp IC 90. The switch circuit 91 selects either one of the signal groups $R_1$, $G_1$, $B_1$, $H_1$, $V_1$ or $R_2$, $G_2$, $B_2$, $H_2$, $V_2$. The switched signal G, the horizontal synchronization signal and the vertical synchronization signal are then sent to output terminals 90u, 90v and 90w.

As input terminals for receiving one image signal, the integrated circuit device 90 includes two groups of input terminals, one 90a to 90e and the other 90f to 90m. In some cases, however, an image signal outputted by a computer consists of the signal R, the signal G which includes the synchronization signal and the signal B, but does not include other vertical synchronization signal V and other horizontal synchronization signal H except for the signals R, G and B. In some other cases, an image signal outputted by a computer includes the signals R, G and B as well as other vertical and horizontal synchronization signals V and H, but the synchronization signal is not included in the signal G. In still other cases, an image signal outputted by a computer includes the signals R, G and B as well as other vertical and horizontal synchronization signals V and H, and the synchronization signal is included in the signal G. The integrated circuit device 90 is capable of dealing with either one of these three cases.

Sixth Preferred Embodiment

Figure 15:
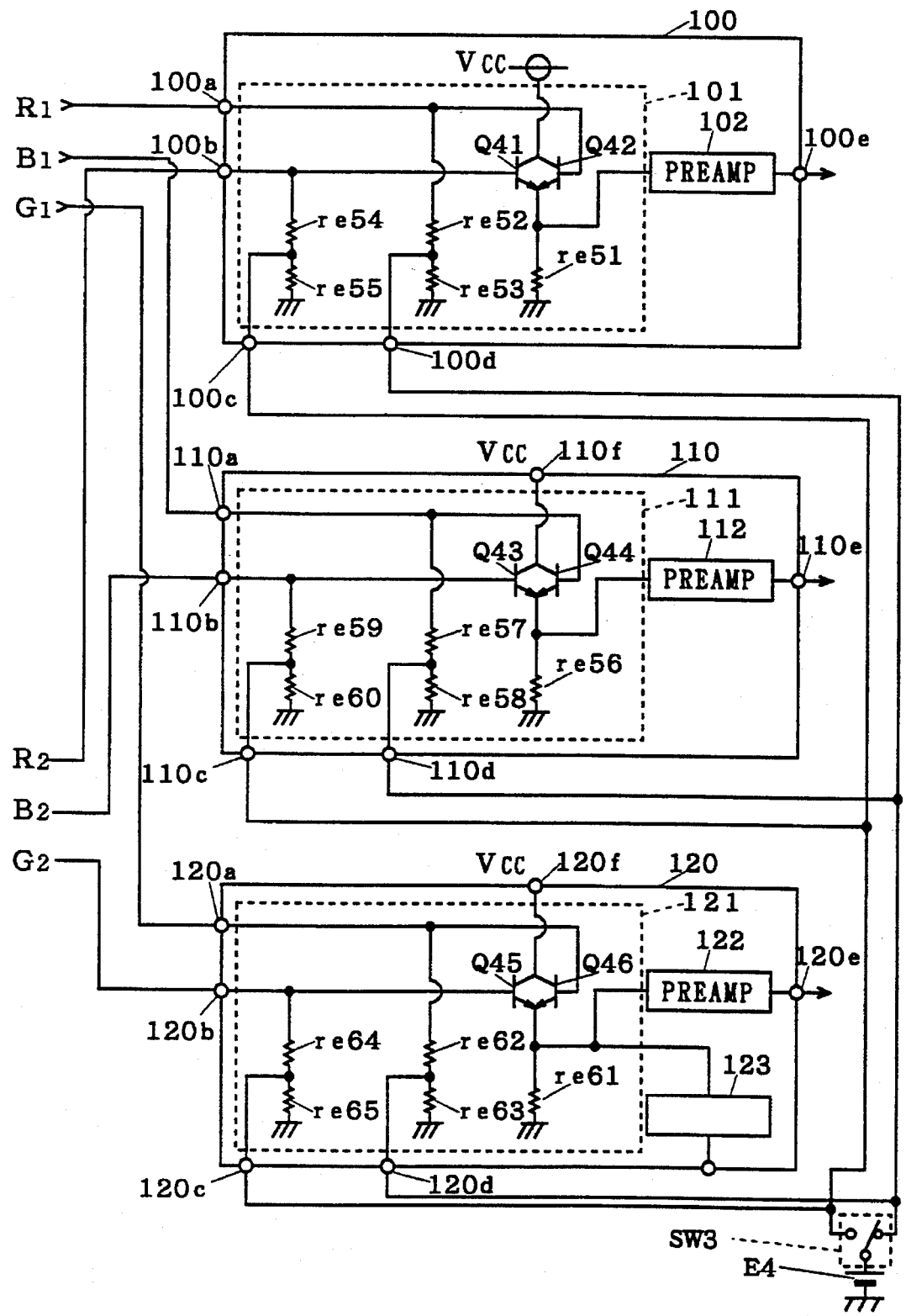
FIG. 15 is a block diagram showing a structure of an integrated circuit device for processing an image signal according to a sixth preferred embodiment of the present invention.

Now, a sixth preferred embodiment of the present invention will be described with reference to FIG. 15. FIG. 15 is a view of an integrated circuit device for processing an image signal according to the sixth preferred embodiment of the present invention. As mentioned earlier, the preamp is formed by three ICs respectively for the signals R, G and B in some cases. In the chips of integrated circuit devices 100, 110 and 120 of FIG. 15, switch circuits 101, 111 and 121 are disposed, respectively, for receiving and processing the signals R, G and B at input terminals 100a, 100b, 110a, 110b, 120a and 120b. Output terminals 100e, 110e, 120e are disposed for outputting switched output signals. Buffered signals for separating synchronization signals are outputted at output terminals 100d, 110d and 120d.

Although a synchronization separating output terminal is disposed only in the IC for the signal G in FIG. 15, signals which are the same as the signal G may be used as the signals R and B to use one IC commonly for the three channels. Further, output signals for synchronization separation may be routed to the output terminals after processed by low-pass filters. Still further, a synchronization separating circuit may be disposed in each IC to output a separated synchronization signal at the terminal.

Figure 16:
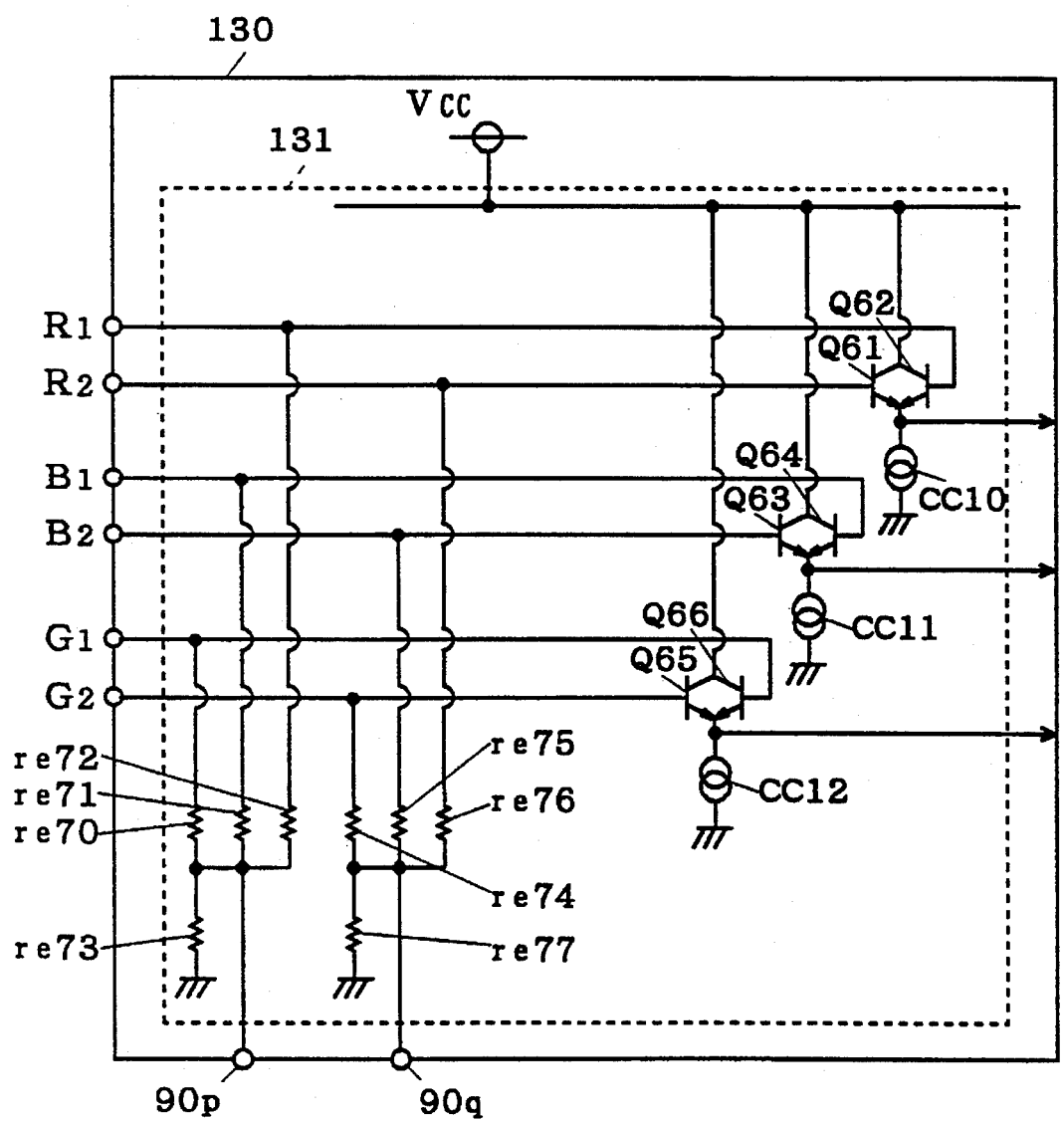
FIG. 16 is a block diagram showing other structure of the switch circuits of the respective embodiments.

Although the switch circuits are each formed by transistors and resistors in the preferred embodiments hereinabove described, the switch circuits may be each formed by transistors, resistors and constant current sources. For instance, the switch circuit 31 of FIG. 3 may be replaced with a switch circuit 131 as that shown in FIG. 16. More exactly, NPN transistors Q61 to Q66 correspond to the NPN transistors Q1 to Q6, resistors re70 to re77 correspond to the resistors 4 to re11 and constant current sources cc10 to cc12 correspond to the resistors re1 to re3.

The foregoing has described the preferred embodiments each as switching two different types of signals. However, the present invention is also applicable to where three or more types of signals are to be switched.

While the invention has been described in detail, the foregoing description is in all aspects illustrative and not restrictive. It is understood that numerous other modifications and variations can be devised without departing from the scope of the invention.

I claim:

1. An integrated circuit device for processing an image signal, comprising:

a first input terminal formed in an integrated circuit substrate to receive a first image signal which includes a first synchronization signal;

a second input terminal formed in said integrated circuit substrate to receive a second image signal which includes a second synchronization signal;

a control terminal formed in said integrated circuit substrate to receive a switch signal;

a synchronization signal output terminal formed in said integrated circuit substrate to output a signal which includes said first or said second synchronization signal;

switch means formed in said integrated circuit substrate, said switch means having first and second image signal input terminals which are respectively connected to said first and said second input terminals, said switch means having a switch signal input terminal which is connected to said control terminal, said switch means having an image signal output terminal, from said image signal output terminal, said switch means outputting either one of said first and said second image signals which are received at said first and said second image input terminals in accordance with said switch signal which is received at said switch signal input terminal;

signal separation means formed in said integrated circuit substrate, said signal separation means having a high impedance input terminal which is connected to said image signal output terminal of said switch means, said high impedance input terminal having an input impedance which is at least 100 times higher than an output impedance of said switch means, said signal separation means having an output terminal which is connected to said synchronization signal output terminal, said signal separation means receiving either one of said first and said second image signals at said high impedance input terminal, said signal separation means removing a high-frequency component including a maximum frequency of one of said image signals which is supplied to said signal separation means, said signal separation means at said output terminal outputting a signal component which belongs to a frequency band regarding said first and said second synchronization signals; and amplification means formed in said integrated circuit substrate, said amplification means having an input terminal which is connected directly to said image signal output terminal of said switch means, said amplification means amplifying one of said first and said second image signals which is outputted by said switch means.

2. The integrated circuit device of claim 1, wherein said signal separation means includes:

buffer means having an input terminal which is connected to said high impedance input terminal and an output terminal for buffering and outputting one of said first and said second image signals which is supplied to said signal separation means at said input terminal, said buffer means supplying a high impedance to said high impedance input terminal; and a low-pass filter having a signal input terminal which is connected to said output terminal of said buffer means and a signal output terminal which is connected to said output terminal of said signal separation means, said low-pass filter removing a high-frequency component including a maximum frequency of one of said image signals which is supplied to said signal separation means, said low-pass filter outputting at said output terminal a signal component which belongs to a frequency band regarding said first and said second synchronization signals.

3. The integrated circuit device of claim 2, wherein said switch means includes:

a first bipolar transistor having a base which is connected to said first image signal input terminal, a collector which receives said first power source potential and an emitter which is connected to said image signal output terminal;

a second bipolar transistor having a base which is connected to said second image signal input terminal, a collector which receives said first power source potential and an emitter which is connected to said image signal output terminal;

first resistor means having one end which is connected to said image signal output terminal and another end which receives said second power source potential;

first variable resistor means having one end which is connected to said base of said first bipolar transistor and another end which receives said second power source potential, said first variable resistor means switching between a high resistance value and a low resistance value in accordance with said switch signal which is received at said switch signal input terminal; and second variable resistor means having one end which is connected to said base of said second bipolar transistor and another end which receives said second power source potential, said second variable resistor means switching between a high resistance value and a low resistance value in accordance with said switch signal which is received at said switch signal input terminal, and wherein said first and said second variable resistor means switch their resistance values in accordance with said switch signal so that their resistance values are complementary to each other.

4. The integrated circuit device of claim 3, wherein said buffer means includes a current path disposed between a first and a second power source potentials through which a predetermined constant current flows, a third bipolar transistor having a collector, an emitter which is connected to said output terminal of said buffer means and a base which is connected to said high impedance signal input terminal of said signal separation means, said collector and said emitter being connected in a forward direction in said current path, and wherein said low-pass filter includes:

second resistor means having one end which is connected to said emitter of said third bipolar transistor and another end which is connected to said output terminal of said signal separation means; and a capacitor having one end which is connected to said output terminal of said signal separation means and another end which receives said first or said second power source potential.

5. The integrated circuit device of claim 1, wherein said signal separation means includes:

buffer means having an input terminal which is connected to said high impedance input terminal and an output terminal for buffering and outputting one of said first and said second image signals which is supplied to said signal separation means at said input terminal, said buffer means supplying a high impedance to said high impedance input terminal; and a synchronization separating circuit having a signal input terminal which is connected to said output terminal of said buffer means and a signal output terminal which is connected to said output terminal of said signal separation means, said synchronization separating circuit separating said first or said second synchronization signal from said one of said first and said second image signals which is supplied to said signal separation means and outputting said first or said second synchronization signal at said signal output terminal.

6. An integrated circuit device for processing an image signal, comprising:

a first input terminal formed in an integrated circuit substrate to receive a first image signal which includes a first synchronization signal;

a second input terminal formed in said integrated circuit substrate to receive a second image signal which includes a second synchronization signal;

a control terminal formed in said integrated circuit substrate to receive a switch signal;

a synchronization signal output terminal formed in said integrated circuit substrate to output a signal which includes said first or said second synchronization signal;

switch means formed in said integrated circuit substrate, said switch means having first and second image signal input terminals which are respectively connected to said first and said second input terminals, said switch means having a switch signal input terminal which is connected to said control terminal, said switch means having an image signal output terminal, from said image signal output terminal, said switch means outputting either one of said first and said second image signals which are received at said first and said second image input terminals in accordance with said switch signal which is received at said switch signal input terminal;

signal separation means formed in said integrated circuit substrate, said signal separation means having a high impedance input terminal which is connected to said image signal output terminal of said switch means, said high impedance input terminal having an input impedance which is sufficiently higher than an output impedance of said switch means, said signal separation means having an output terminal which is connected to said synchronization signal output terminal, said signal separation means receiving either one of said first and said second image signals at said high impedance input terminal, said signal separation means removing a high-frequency component including a maximum frequency of one of said image signals which is supplied to said signal separation means, said signal separation means at said output terminal outputting a signal component which belongs to a frequency band regarding said first and said second synchronization signals; and amplification means formed in said integrated circuit substrate, said amplification means having an input terminal which is connected directly to said image signal output terminal of said switch means, said amplification means amplifying one of said first and said second image signals which is outputted by said switch means;

wherein said signal separation means includes a current path disposed between first and second power source potentials through which a predetermined constant current flows, a first bipolar transistor having a collector and an emitter connected in a forward direction in said current path and a base connected to said high impedance input terminal of said switch means, said emitter of said first bipolar transistor being connected to said output terminal of said signal separation means, and wherein said first bipolar transistor has a cutoff frequency which is higher than a signal component which belongs to a frequency band regarding said first and said second synchronization signals but is lower than a cutoff frequency of said image signal.

7. The integrated circuit device of claim 6, wherein said switch means includes:

a second bipolar transistor having a base which is connected to said first image signal input terminal, a collector which receives said first power source potential and an emitter which is connected to said image signal output terminal;

a third bipolar transistor having a base which is connected to said second image signal input terminal, a collector which is connected to said first power source potential and an emitter which is connected to said image signal output terminal;

first resistor means having one end which is connected to said image signal output terminal and another end which receives said second power source potential;

first variable resistor means having one end which is connected to said base of said second bipolar transistor and another end which receives said second power source potential, said first variable resistor means switching between a high resistance value and a low resistance value in accordance with said switch signal which is received at said switch signal input terminal; and second variable resistor means having one end which is connected to said base of said third bipolar transistor and another end which receives said second power source potential, said second variable resistor means switching between a high resistance value and a low resistance value in accordance with said switch signal which is received at said switch signal input terminal, and wherein said first and said second variable resistor means switch their resistance values in accordance with said switch signal so that their resistance values are complementary to each other.

8. The integrated circuit device of claim 7, wherein an area where said base and said emitter of said first bipolar transistor face each other is smaller than a corresponding area of each one of said second and said third bipolar transistors.

9. An integrated circuit device for processing a first image signal and a second image signal in one integrated circuit substrate, said first image signal including a first chrominance signal which includes a first synchronization signal, a second chrominance signal which is different from said first chrominance signal and a third chrominance signal which is different from said first and said second chrominance signals, said second image signal including a fourth chrominance signal which includes a second synchronization signal, a fifth chrominance signal which is different from said fourth chrominance signal and a sixth chrominance signal which is different from said fourth and said fifth chrominance signals, comprising:

first, second and third input terminals formed in said integrated circuit substrate to receive said first, said second and said third chrominance signals, respectively;

fourth, fifth and sixth input terminals formed in said integrated circuit substrate to receive said fourth, said fifth and said sixth chrominance signals, respectively;

a control terminal formed in said integrated circuit substrate to receive a switch signal;

a synchronization signal output terminal formed in said integrated circuit substrate to output a signal which includes said first or said second synchronization signal from said integrated circuit substrate;

switch means formed in said integrated circuit substrate, said switch means having first to sixth chrominance signal input terminals which are respectively connected to said first to said sixth input terminals, said switch means having a switch signal input terminal which is connected to said control terminal, said switch means having first to third chrominance signal output terminals, said switch means selectively outputting said first to said third chrominance signals or said fourth to said sixth chrominance signals, respectively, at said first to said third chrominance signal output terminals in accordance with said switch signal which is received at said switch signal input terminal;

signal separation means formed in said integrated circuit substrate, said signal separation means having a high impedance input terminal which is connected to said first chrominance signal output terminal of said switch means, said high impedance input terminal having an input impedance which is at least 100 times higher than an output impedance of said first chrominance signal output terminal, said signal separation means having an output terminal which is connected to said synchronization signal output terminal, said signal separation means removing a high-frequency component including a maximum frequency of said chrominance signal which is supplied to said signal separation means at said high impedance input terminal and outputting a signal component which belongs to a frequency band regarding said first and said second synchronization signals at said output terminal; and amplification means formed in said integrated circuit substrate, said amplification means having a plurality of input terminals which are respectively connected to said first, said second and said third chrominance signal output terminals of said switch means, said amplification means amplifying said chrominance signal which is outputted by said switch means.

10. The integrated circuit device of claim 9, wherein said signal separation means includes:

buffer means having an input terminal which is connected to said high impedance input terminal and an output terminal for buffering and outputting one of said first and said fourth chrominance signals which is supplied to said signal separation means at said input terminal, said buffer means supplying a high impedance to said high impedance input terminal; and a low-pass filter having a signal input terminal which is connected to said output terminal of said buffer means and a signal output terminal which is connected to said output terminal of said signal separation means, said low-pass filter removing a high-frequency component including a maximum frequency of said first or said fourth chrominance signal which is supplied to said signal separation means and outputting a signal component which belongs to a frequency band regarding said first and said second synchronization signals at said output terminal.

11. The integrated circuit device of claim 10, wherein said switch means includes:

a first bipolar transistor having a base which is connected to said first chrominance signal input terminal, a collector which receives said first power source potential and an emitter which is connected to said first chrominance signal output terminal;

a second bipolar transistor having a base which is connected to said fourth chrominance signal input terminal, a collector which receives said first power source potential and an emitter which is connected to said first chrominance signal output terminal;

first resistor means having one end which is connected to said image signal output terminal and another end which receives said second power source potential;

first variable resistor means having one end which is connected to said base of said first bipolar transistor and another end which receives said second power source potential, said first variable resistor means switching between a high resistance value and a low resistance value in accordance with said switch signal which is received at said switch signal input terminal; and second variable resistor means having one end which is connected to said base of said second bipolar transistor and another end which receives said second power source potential, said second variable resistor means switching between a high resistance value and a low resistance value in accordance with said switch signal which is received at said switch signal input terminal, wherein said first and said second variable resistor means switch the resistance values in a mutually complementary manner in accordance with said switch signal.

12. The integrated circuit device of claim 11, wherein said buffer means includes a current path disposed between a first and a second power source potentials through which a predetermined constant current flows, a third bipolar transistor having a collector, an emitter which is connected to said output terminal of said buffer means and a base which is connected to said high impedance signal input terminal of said signal separation means, said collector and said emitter being connected in a forward direction in said current path, and wherein said low-pass filter includes:

second resistor means having one end which is connected to said emitter of said third bipolar transistor and another end which is connected to said output terminal of said signal separation means; and a capacitor having one end which is connected to said output terminal of said signal separation means and another end which receives said first or said second power source potential.

13. The integrated circuit device of claim 9, wherein said signal separation means includes:

buffer means having an input terminal which is connected to said high impedance input terminal and an output terminal for buffering and outputting one of said first and said second image signals which is supplied to said signal separation means at said input terminal, said buffer means supplying a high impedance to said high impedance input terminal; and a synchronization separating circuit having a signal input terminal which is connected to said output terminal of said buffer means and a signal output terminal which is connected to said output terminal of said signal separation means, said synchronization separating circuit separating said first or said second synchronization signal from said one of said first and said second image signals which is supplied to said signal separation means and outputting said first or said second synchronization signal at said signal output terminal.

14. The integrated circuit device of claim 9, wherein said signal separation means includes:

buffer means having an input terminal which is connected to said high impedance input terminal and an output terminal for buffering and outputting said first chrominance signal which is supplied to said signal separation means at said input terminal, said buffer means supplying a high impedance to said high impedance input terminal; and a synchronization separating circuit having a signal input terminal which is connected to said output terminal of said buffer means and a signal output terminal which is connected to said output terminal of said signal separation means, said synchronization separating circuit separating said first synchronization signal from said one of said first and said second image signals which is supplied to said signal separation means and outputting said first synchronization signal at said signal output terminal.

15. An integrated circuit device for processing a first image signal and a second image signal in one integrated circuit substrate, said first image signal including a first chrominance signal which includes a first synchronization signal, a second chrominance signals which is different from said first chrominance signal and a third chrominance signal which is different from said first and said second chrominance signals, said second image signal including a fourth chrominance signal which includes a second synchronization signal, a fifth chrominance signal which is different from said fourth chrominance signal and a sixth chrominance signal which is different from said fourth and said fifth chrominance signals, comprising:

first, second and third input terminals formed in said integrated circuit substrate to receive said first, said second and said third chrominance signals, respectively;

fourth, fifth and sixth input terminals formed in said integrated circuit substrate to receive said fourth, said fifth and said sixth chrominance signals, respectively;

a control terminal formed in said integrated circuit substrate to receive a switch signal;

a synchronization signal output terminal formed in said integrated circuit substrate to output a signal which includes said first or said second synchronization signal from said integrated circuit substrate;

switch means formed in said integrated circuit substrate, said switch means having first to sixth chrominance signal input terminals which are respectively connected to said first to said sixth input terminals, said switch means having a switch signal input terminal which is connected to said control terminal, said switch means having first to third chrominance signal output terminals, said switch means selectively outputting said first to said third chrominance signals or said fourth to said sixth chrominance signals, respectively, at said first to said third chrominance signal output terminals in accordance with said switch signal which is received at said switch signal input terminal;

signal separation means formed in said integrated circuit substrate, said signal separation means having a high impedance input terminal which is connected to said first chrominance signal output terminal of said switch means, said high impedance input terminal having an input impedance which is sufficiently higher than an output impedance of said first chrominance signal output terminal, said signal operation means having an output terminal which is connected to said synchronization signal output terminal, said signal separation means removing a high-frequency component including a maximum frequency of said chrominance signal which is supplied to said signal separation means at said high impedance input terminal and outputting a signal component which belongs to a frequency band regarding said first and said second synchronization signals at said output terminal; and amplification means formed in said integrated circuit substrate, said amplification means having a plurality of input terminals which are respectively connected to said first, said second and said third chrominance signal output terminals of said switch means, said amplification means amplifying said chrominance signal which is outputted by said switch means;

wherein said signal separation means includes a current path disposed between first and second power source potentials through which a predetermined constant current flows, a first bipolar transistor having a collector and an emitter connected in a forward direction in said current path and a base connected to said high impedance input terminal of said signal switch means, and wherein said first bipolar transistor has a cutoff frequency which is higher than a signal component which belongs to a frequency band regarding said first and said second synchronization signals but is lower than a cutoff frequency of said image signal.

16. The integrated circuit device of claim 15, wherein said switch means includes:

a second bipolar transistor having a base which is connected to said first chrominance signal input terminal, a collector which receives said first power source potential and an emitter which is connected to said first chrominance signal output terminal;

a third bipolar transistor having a base which is connected to said second chrominance signal input terminal, a collector which receives said first power source potential and an emitter which is connected to said first chrominance signal output terminal;

first resistor means having one end which is connected to said first chrominance signal output terminal and another end which receives said second power source potential;

first variable resistor means having one end which is connected to said base of said second bipolar transistor and another end which receives said second power source potential, said first variable resistor means switching between a high resistance value and a low resistance value in accordance with said switch signal which is received at said switch signal input terminal; and second variable resistor means having one end which is connected to said base of said third bipolar transistor and another end which receives said second power source potential, said second variable resistor means switching between a high resistance value and a low resistance value in accordance with said switch signal which is received at said switch signal input terminal, and wherein said first and said second variable resistor means switch their resistance values in accordance with said switch signal so that their resistance values are complementary to each other.

17. The integrated circuit device of claim 16, wherein an area where said base and said emitter of said first bipolar transistor face each other is smaller than a corresponding area of each one of said second and said third bipolar transistors.

18. An integrated circuit device for processing a first image signal and a second image signal in one integrated circuit substrate, said first image signal including a first chrominance signal which includes a first synchronization signal, a second chrominance signal which is different from said first chrominance signal and a third chrominance signal which is different from said first and said second chrominance signals, said second image signal including a fourth chrominance signal, a fifth chrominance signal which is different from said fourth chrominance signal and a sixth chrominance signal which is different from said fourth and said fifth chrominance signals, comprising:

a first, a second and a third input terminals formed in said integrated circuit substrate to receive said first, said second and said third chrominance signals, respectively;

a fourth to a seventh input terminals formed in said integrated circuit substrate to receive said fourth to said sixth chrominance signals and said second synchronization signal, respectively;

a control terminal formed in said integrated circuit substrate to receive a switch signal;

a first synchronization signal output terminal formed in said integrated circuit substrate to output a signal which includes said first synchronization signal from said integrated circuit substrate;

a second synchronization signal output terminal formed in said integrated circuit substrate to output a signal which includes said second synchronization signal from said integrated circuit substrate;

switch means formed in said integrated circuit substrate, said switch means having a first to a sixth chrominance signal input terminals which are respectively connected to said first to said sixth input terminals, said switch means having a switch signal input terminal which is connected to said control terminal, said switch means having a synchronization signal input terminal which is connected to said seventh input terminal, said switch means having a synchronization signal output terminal which is connected to said second synchronization signal output terminal, said switch means having a first to a third chrominance signal output terminals, said switch means selectively outputting said first to said third chrominance signals or said fourth to said sixth chrominance signals, respectively, at said first to said third chrominance signal output terminals in accordance with said switch signal which is received at said switch signal input terminal, said switch means determining whether said second synchronization signal is to be outputted at said synchronization signal output terminal;

signal separation means formed in said integrated circuit substrate, said signal separation means having a high impedance input terminal which is connected to said first chrominance signal output terminal of said switch means, said high impedance input terminal having an input impedance which is sufficiently higher than an output impedance of said first chrominance signal output terminal, said signal separation means having an output terminal which is connected to said synchronization signal output terminal, said signal separation means removing a high-frequency component including a maximum frequency of said chrominance signal which is received at said high impedance input terminal and outputting a signal component which belongs to a frequency band regarding said first and said second synchronization signals at said output terminal; and amplification means formed in said integrated circuit substrate, said amplification means having a plurality of input terminals which are respectively connected directly to said first, said second and said third chrominance signal output terminals of said switch means, said amplification means amplifying said chrominance signal which is outputted by said switch means.

19. The integrated circuit device of claim 18, wherein said signal separation means includes a current path disposed between a first and a second power source potentials through which a predetermined constant current flows, a first bipolar transistor having a collector and an emitter connected in a forward direction in said current path and a base connected to said image signal output terminal of said switch means, said emitter of said first bipolar transistor being connected to said output terminal of said signal separation means, and wherein said first bipolar transistor has a cutoff frequency which is higher than a signal component which belongs to a frequency band regarding said first synchronization signal but is lower than a cutoff frequency of said first chrominance signal.

20. The integrated circuit device of claim 19, wherein said switch means includes:

a second bipolar transistor having a base which is connected to said first chrominance signal input terminal, a collector which receives said first power source potential and an emitter which is connected to said first chrominance signal output terminal;

a third bipolar transistor having a base which is connected to said fourth chrominance signal input terminal, a collector which receives said first power source potential and an emitter which is connected to said first chrominance signal output terminal;

first resistor means having one end which is connected to said image signal output terminal and another end which receives said second power source potential;

first variable resistor means having one end which is connected to said base of said second bipolar transistor and another end which receives said second power source potential, said first variable resistor means switching between a high resistance value and a low resistance value in accordance with said switch signal which is received at said switch signal input terminal; and second variable resistor means having one end which is connected to said base of said third bipolar transistor and another end which receives said second power source potential, said second variable resistor means switching between a high resistance value and a low resistance value in accordance with said switch signal which is received at said switch signal input terminal, and wherein said first and said second variable resistor means switch their resistance values in accordance with said switch signal so that their resistance values are complementary to each other.

21. The integrated circuit device of claim 20, wherein an area where said base and said emitter of said first bipolar transistor face each other is smaller than a corresponding area of each one of said second and said third bipolar transistors.

22. The integrated circuit device of claim 18, wherein said signal separation means includes:

buffer means having an input terminal which is connected to said high impedance input terminal and an output terminal for buffering and outputting said first chrominance signal which is supplied to said signal separation means at said input terminal, said buffer means supplying a high impedance to said high impedance input terminal; and a low-pass filter having a signal input terminal which is connected to said output terminal of said buffer means and a signal output terminal which is connected to said output terminal of said signal separation means, said low-pass filter removing a high-frequency component including a maximum frequency of said first chrominance signal which is supplied to said signal separation means and outputting a signal component which belongs to a frequency band regarding said first synchronization signal at said output terminal.

23. The integrated circuit device of claim 22, wherein said switch means includes:

a first bipolar transistor having a base which is connected to said first chrominance signal input terminal, a collector which is connected to said first power source potential and an emitter which is connected to said first chrominance signal output terminal;

a second bipolar transistor having a base which is connected to said fourth chrominance signal input terminal, a collector which is connected to said first power source potential and an emitter which is connected to said first chrominance signal output terminal;

first resistor means having one end which is connected to said first chrominance signal output terminal and another end which is connected to said second power source potential;

first variable resistor means having one end which is connected to said base of said first bipolar transistor and another end which receives said second power source potential, said first variable resistor means switching between a high resistance value and a low resistance value in accordance with said switch signal which is received at said switch signal input terminal; and second variable resistor means having one end which is connected to said base of said second bipolar transistor and another end which receives said second power source potential, said second variable resistor means switching between a high resistance value and a low resistance value in accordance with said switch signal which is received at said switch signal input terminal, wherein said first and said second variable resistor means switch the resistance values in a mutually complementary manner in accordance with said switch signal.

24. The integrated circuit device of claim 23, wherein said buffer means includes a current path disposed between a first and a second power source potentials through which a predetermined constant current flows, a third bipolar transistor having a collector, an emitter which is connected to said output terminal of said buffer means and a base which is connected to said high impedance signal input terminal of said signal separation means, said collector and said emitter being connected in a forward direction in said current path, and wherein said low-pass filter includes:

second resistor means having one end which is connected to said emitter of said third bipolar transistor and another end which is connected to said output terminal of said signal separation means; and a capacitor having one end which is connected to said output terminal of said signal separation means and another end which receives said first or said second power source potential.

25. An integrated circuit device for processing a first image signal and a second image signal in one integrated circuit substrate, said first image signal including a first chrominance signal which includes a first synchronization signal, a second chrominance signal which is different from said first chrominance signal and a third chrominance signal which is different from said first and said second chrominance signals, said second image signal including a fourth chrominance signal which includes a second synchronization signal, a fifth chrominance signal which is different from said fourth chrominance signal and a sixth chrominance signal which is different from said fourth and said fifth chrominance signals, comprising:

a first input terminal formed in a first integrated circuit substrate of said plurality of said integrated circuit substrates to receive said first chrominance signal;

a second input terminal formed in said first integrated circuit substrate to receive said fourth chrominance signal;

a first control terminal formed in said first integrated circuit substrate to receive a switch signal;

a synchronization signal output terminal formed in said first integrated circuit substrate to output a signal which includes said first or said second synchronization signal from said integrated circuit substrates;

first switch means formed in said first integrated circuit substrate, said first switch means having a first and a second chrominance signal input terminals which are respectively connected to said first and said second input terminals, said first switch means having a first switch signal input terminal which is connected to said control terminal, said first switch means having a first chrominance signal output terminal, from said first chrominance signal output terminal, said first switch means selectively outputting said first or said fourth chrominance signal in accordance with said switch signal which is received at said first switch signal input terminal;

signal separation means formed in said first integrated circuit substrate, said signal separation means having a high impedance input terminal which is connected to said first chrominance signal output terminal of said first switch means, said high impedance input terminal having an input impedance which is sufficiently higher than an output impedance of said first chrominance signal output terminal, said signal separation means having an output terminal which is connected to said synchronization signal output terminal, said signal separation means removing a high-frequency component including a maximum frequency of said first or said fourth chrominance signal which is received at said high impedance input terminal and outputting a signal component which belongs to a frequency band regarding said first and said second synchronization signals at said output terminal; and first amplification means formed in said first integrated circuit substrate, said amplification means amplifying said first or said fourth chrominance signal which is outputted by said first switch means.

26. The integrated circuit device of claim 25, further comprising:

a third input terminal formed in a second integrated circuit substrate of said plurality of said integrated circuit substrates to receive said second chrominance signal;

a fourth input terminal formed in said second integrated circuit substrate to receive said fifth chrominance signal;

a second control terminal formed in said second integrated circuit substrate to receive a switch signal;

second switch means formed in said second integrated circuit substrate, said second switch means having a third and a fourth chrominance signal input terminals which are respectively connected to said third and said fourth input terminals, a second switch signal input terminal which is connected to said second control terminal and a second chrominance signal input terminal, at said second chrominance signal output terminal, said second switch means selectively outputting said second or said fifth chrominance signal in accordance with said switch signal which is received at said second switch signal input terminal;

second amplification means formed in said second integrated circuit substrate, said second amplification means amplifying said second or said fifth chrominance signal which is outputted by said second switch means;

a fifth input terminal formed in a third integrated circuit substrate of said plurality of said integrated circuit substrates to receive said third chrominance signal;

a sixth input terminal formed in said third integrated circuit substrate to receive said sixth chrominance signal;

a third control terminal formed in said third integrated circuit substrate to receive a switch signal;

third switch means formed in said third integrated circuit substrate, said third switch means having a fifth and a sixth chrominance signal input terminals which are respectively connected to said fifth and said sixth input terminals, a third switch signal input terminal which is connected to said third control terminal and a third chrominance signal input terminal, at said third chrominance signal output terminal, said third switch means selectively outputting said third or said sixth chrominance signal in accordance with said switch signal which is received at said third switch signal input terminal; and third amplification means formed in said third integrated circuit substrate, said third amplification means amplifying said third or said sixth chrominance signal which is outputted by said third switch means.

27. The integrated circuit device of claim 25, wherein said signal separation means includes a current path disposed between a first and a second power source potentials through which a predetermined constant current flows, a first bipolar transistor having a collector and an emitter connected in a forward direction in said current path and a base connected to said high impedance input terminal of said signal separation means, said emitter of said first bipolar transistor being connected to said output terminal of said signal separation means, and wherein said first bipolar transistor has a cutoff frequency which is higher than a signal component which belongs to a frequency band regarding said first and said second synchronization signals but is lower than a cutoff frequency of said image signal.

28. The integrated circuit device of claim 27, wherein said switch means includes:

a second bipolar transistor having a base which is connected to said first chrominance signal input terminal, a collector which receives said first power source potential and an emitter which is connected to said first chrominance signal output terminal;

a third bipolar transistor having a base which is connected to said second chrominance signal input terminal, a collector which receives said first power source potential and an emitter which is connected to said first chrominance signal output terminal;

first resistor means having one end which is connected to said image signal output terminal and another end which receives said second power source potential;

first variable resistor means having one end which is connected to said base of said second bipolar transistor and another end which receives said second power source potential, said first variable resistor means switching between a high resistance value and a low resistance value in accordance with said switch signal which is received at said switch signal input terminal; and second variable resistor means having one end which is connected to said base of said third bipolar transistor and another end which receives said second power source potential, said second variable resistor means switching between a high resistance value and a low resistance value in accordance with said switch signal which is received at said switch signal input terminal, and wherein said first and said second variable resistor means switch their resistance values in accordance with said switch signal so that their resistance values are complementary to each other.

29. The integrated circuit device of claim 28, wherein an area where said base and said emitter of said first bipolar transistor face each other is smaller than a corresponding area of each one of said second and said third bipolar transistors.

30. The integrated circuit device of claim 25, wherein said signal separation means includes:

buffer means having an input terminal which is connected to said high impedance input terminal and an output terminal for buffering and outputting one of said first and second chrominance signals which is supplied to said signal separation means at said input terminal, said buffer means supplying a high impedance to said high impedance input terminal; and a low-pass filter having a signal input terminal which is connected to said output terminal of said buffer means and a signal output terminal which is connected to said output terminal of said signal separation means, said low-pass filter removing a high-frequency component including a maximum frequency of said image signal which is supplied to said signal separation means and outputting a signal component which belongs to a frequency band regarding said first and said second synchronization signals at said output terminal.

31. The integrated circuit device of claim 30, wherein said switch means includes:

a first bipolar transistor having a base which is connected to said first chrominance signal input terminal, a collector which receives said first power source potential and an emitter which is connected to said first chrominance signal output terminal;

a second bipolar transistor having a base which is connected to said second chrominance signal input terminal, a collector which receives said first power source potential and an emitter which is connected to said first chrominance signal output terminal;

first resistor means having one end which is connected to said first chrominance signal output terminal and another end which receives said second power source potential;

first variable resistor means having one end which is connected to said base of said first bipolar transistor and another end which receives said second power source potential, said first variable resistor means switching between a high resistance value and a low resistance value in accordance with said switch signal which is received at said switch signal input terminal; and second variable resistor means having one end which is connected to said base of said second bipolar transistor and another end which receives said second power source potential, said second variable resistor means switching between a high resistance value and a low resistance value in accordance with said switch signal which is received at said switch signal input terminal, wherein said first and said second variable resistor means switch the resistance values in a mutually complementary manner in accordance with said switch signal.

32. The integrated circuit device of claim 31, wherein said buffer means includes a current path disposed between a first and a second power source potentials through which a predetermined constant current flows, a third bipolar transistor having a collector, an emitter which is connected to said output terminal of said buffer means and a base which is connected to said high impedance signal input terminal of said signal separation means, said collector and said emitter being connected in a forward direction in said current path, and wherein said low-pass filter includes:
second resistor means having one end which is connected to said emitter of said third bipolar transistor and another end which is connected to said output terminal of said signal separation means; and
a capacitor having one end which is connected to said output terminal of said signal separation means and another end which receives said first or said second power source potential.

33. The integrated circuit device of claim 25, wherein said signal separation means includes:

buffer means having an input terminal which is connected to said high impedance input terminal and an output terminal for buffering and outputting said first or said fourth chrominance signal which is supplied to said signal separation means at said input terminal, said buffer means supplying a high impedance to said high impedance input terminal; and a synchronization separating circuit having a signal input terminal which is connected to said output terminal of said buffer means and a signal output terminal which is connected to said output terminal of said signal separation means, said synchronization separating circuit separating said first or said second synchronization signal from said first or said fourth chrominance signal which is supplied to said signal separation means and outputting said first or said second synchronization signal at said signal output terminal.

\* \* \* \* \*